(12) United States Patent
Ge et al.

(10) Patent No.: US 10,854,629 B2
(45) Date of Patent: Dec. 1, 2020

(54) THREE-DIMENSIONAL MEMORY DEVICE CONTAINING ASYMMETRIC, DIFFERENT SIZE SUPPORT PILLARS AND METHOD FOR MAKING THE SAME

(71) Applicant: SANDISK TECHNOLOGIES LLC, Addison, TX (US)

(72) Inventors: Chun Ge, Fremont, CA (US); Jixin Yu, Milpitas, CA (US); Fabo Yu, San Ramon, CA (US); Xin Yuan Li, Yokkaichi (JP); Yanli Zhang, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/368,007

(22) Filed: Mar. 28, 2019

(65) Prior Publication Data
US 2020/0312865 A1 Oct. 1, 2020

(51) Int. Cl.
*H01L 27/11578* (2017.01)
*H01L 27/11582* (2017.01)
(Continued)

(52) U.S. Cl.
CPC .... *H01L 27/11582* (2013.01); *H01L 27/1157* (2013.01); *H01L 27/11519* (2013.01);
(Continued)

(58) Field of Classification Search
CPC .................................................. H01L 27/11578
See application file for complete search history.

(56) References Cited

U.S. PATENT DOCUMENTS 5,915,167 A   6/1999 Leedy
9,576,967 B1  2/2017 Kimura et al.
(Continued)

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
(Continued)

*Primary Examiner* — Peniel M Gumedzoe
*Assistant Examiner* — Christopher A Johnson
(74) *Attorney, Agent, or Firm* — The Marbury Law Group PLLC

(57) ABSTRACT

An alternating stack of insulating layers and spacer material layers is formed over a substrate. A staircase region having stepped surfaces is formed by patterning the alternating stack. Memory opening fill structures are formed in a memory array region, and support pillar structures are formed in the staircase region. Each of the memory stack structures includes a memory film and a vertical semiconductor channel. The support pillar structures include first support pillar structures and having a first maximum lateral dimension and second support pillar structures having a second maximum lateral dimension that is less than the first maximum lateral dimension and interlaced with the first support pillar structures. The sacrificial material layers are replaced with electrically conductive layers. The second support pillar structures are positioned interstitially among the first support pillar structures and contact via structures that are formed on the electrically conductive layers to provide additional structural support.

2 Claims, 34 Drawing Sheets

(51) Int. Cl.
  *H01L 27/11573* (2017.01)
  *H01L 27/1157* (2017.01)
  *H01L 27/11565* (2017.01)
  *H01L 27/11558* (2017.01)
  *H01L 27/11524* (2017.01)
  *H01L 27/11529* (2017.01)
  *H01L 27/11556* (2017.01)
  *H01L 27/11519* (2017.01)

(52) U.S. Cl.
  CPC .. *H01L 27/11524* (2013.01); *H01L 27/11529* (2013.01); *H01L 27/11556* (2013.01); *H01L 27/11558* (2013.01); *H01L 27/11565* (2013.01); *H01L 27/11573* (2013.01)

(56) References Cited

U.S. PATENT DOCUMENTS

| | | | |
|---|---|---|---|
| 9,659,956 | B1 | 5/2017 | Pachamuthu et al. |
| 9,754,963 | B1 | 9/2017 | Kawamura et al. |
| 9,853,038 | B1 | 12/2017 | Cui |
| 9,881,929 | B1 * | 1/2018 | Ravikirthi ......... H01L 27/11519 |
| 9,905,573 | B1 | 2/2018 | Mada et al. |
| 9,978,766 | B1 | 5/2018 | Hosoda et al. |
| 10,014,316 | B2 | 7/2018 | Yu et al. |
| 10,115,632 | B1 | 10/2018 | Masamori et al. |
| 10,141,331 | B1 | 11/2018 | Susuki et al. |
| 2018/0261613 | A1 | 9/2018 | Ariyoshi et al. |

OTHER PUBLICATIONS

U.S. Appl. No. 15/943,859, filed Apr. 3, 2018, Sandisk Technologies LLC.
U.S. Appl. No. 16/021,749, filed Jun. 28, 2018, Sandisk Technologies LLC.
U.S. Appl. No. 16/021,831, filed Jun. 28, 2018, Sandisk Technologies LLC.
U.S. Appl. No. 16/284,240, filed Feb. 25, 2019, Sandisk Technologies LLC.

* cited by examiner

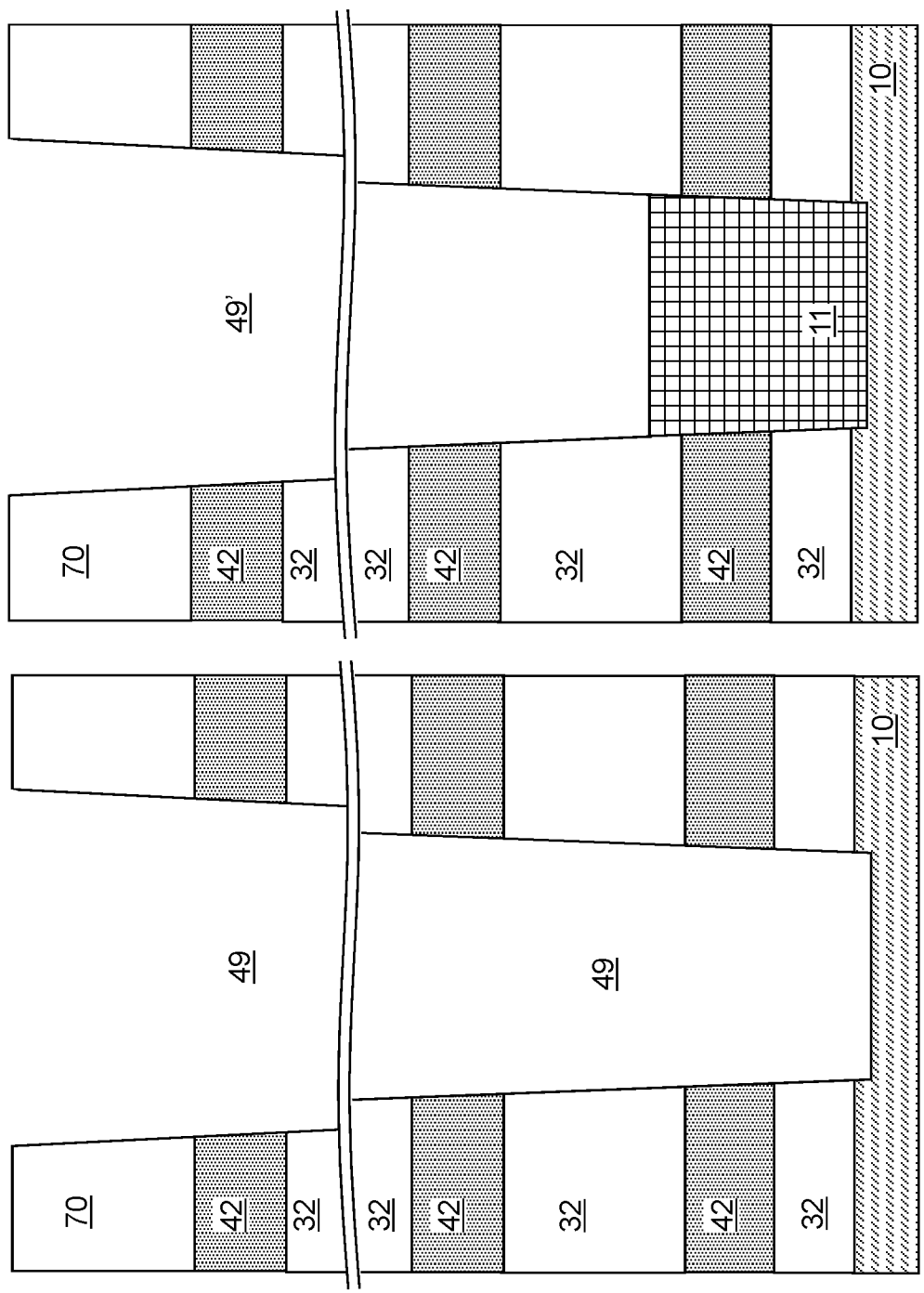

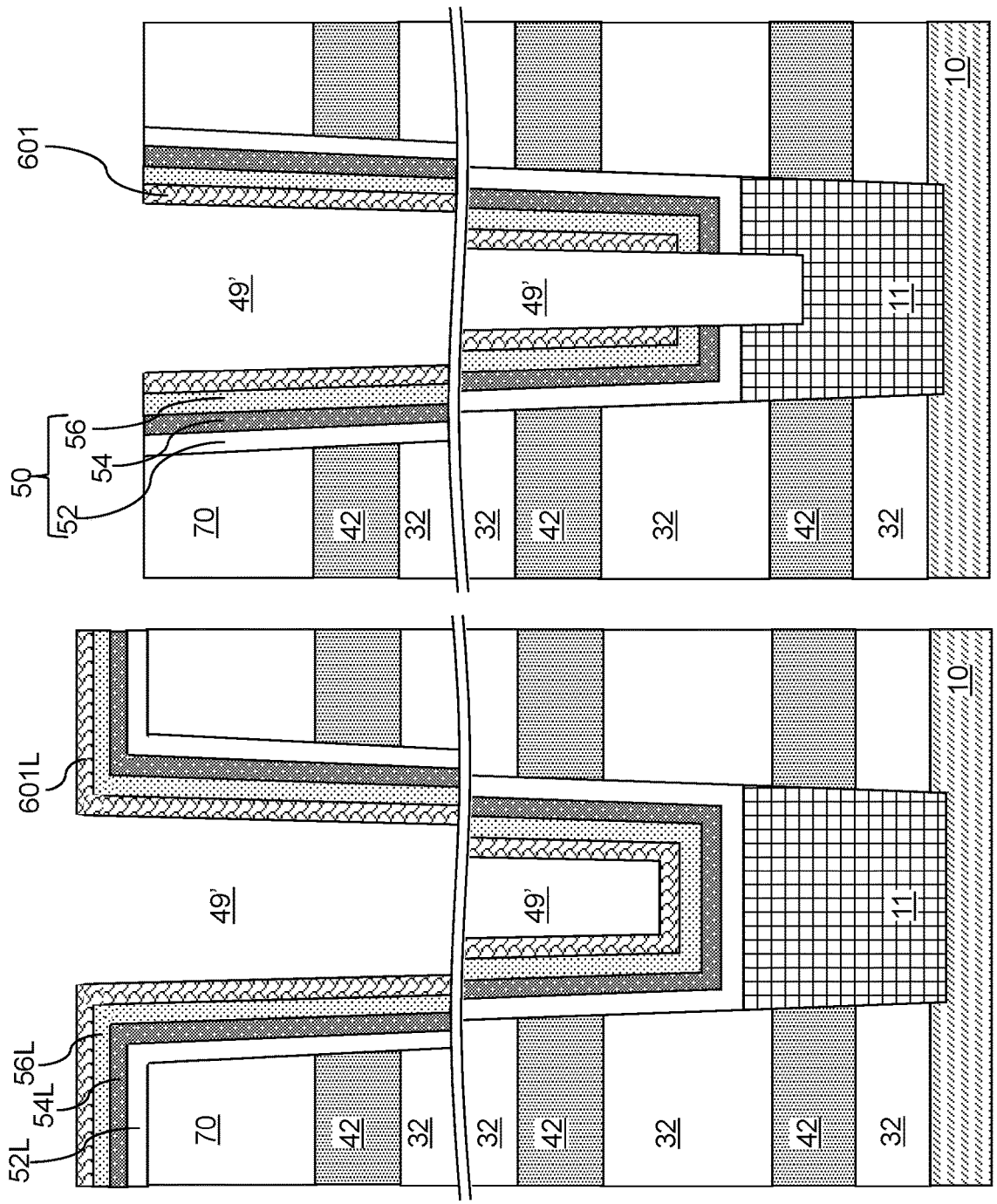

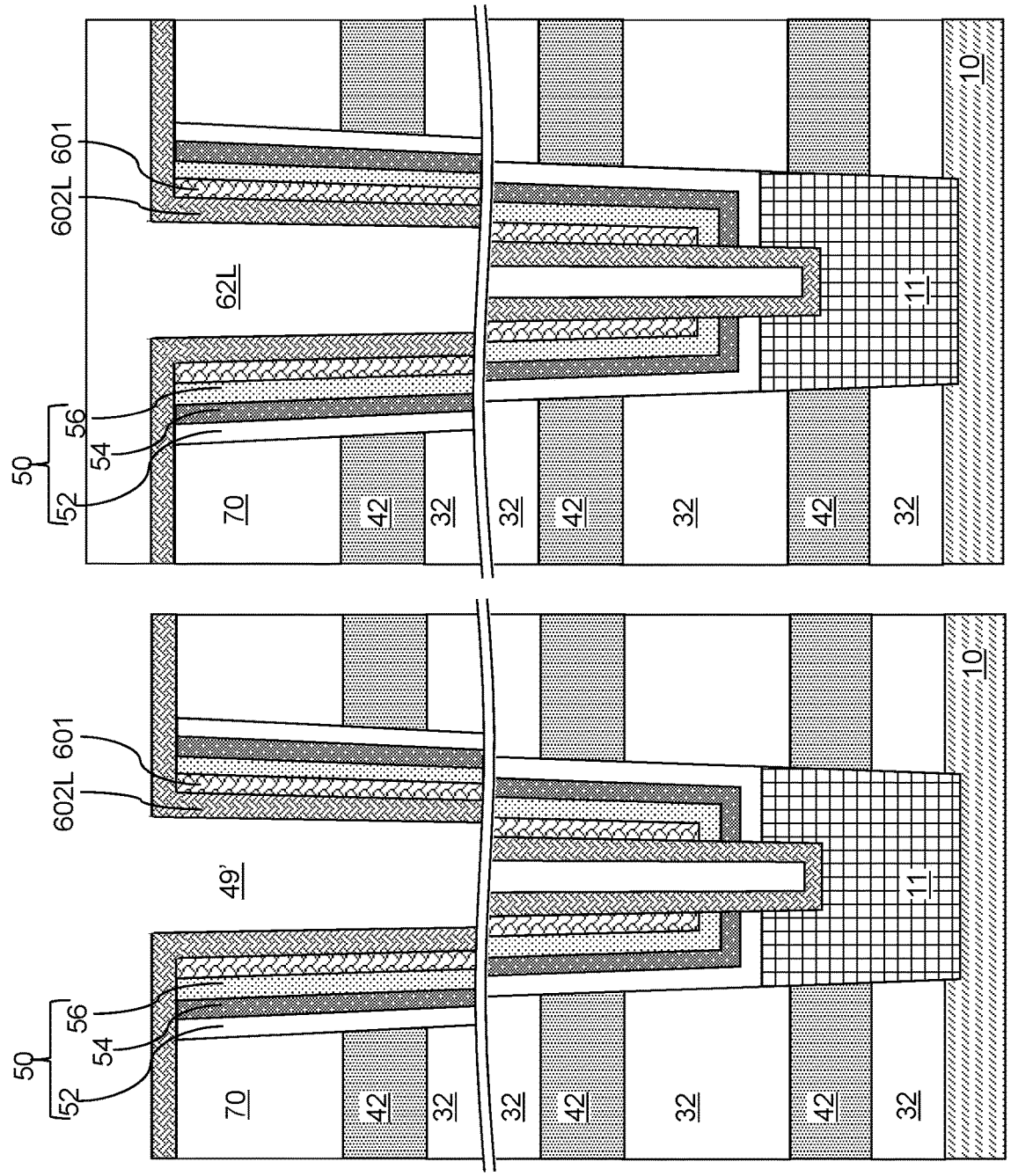

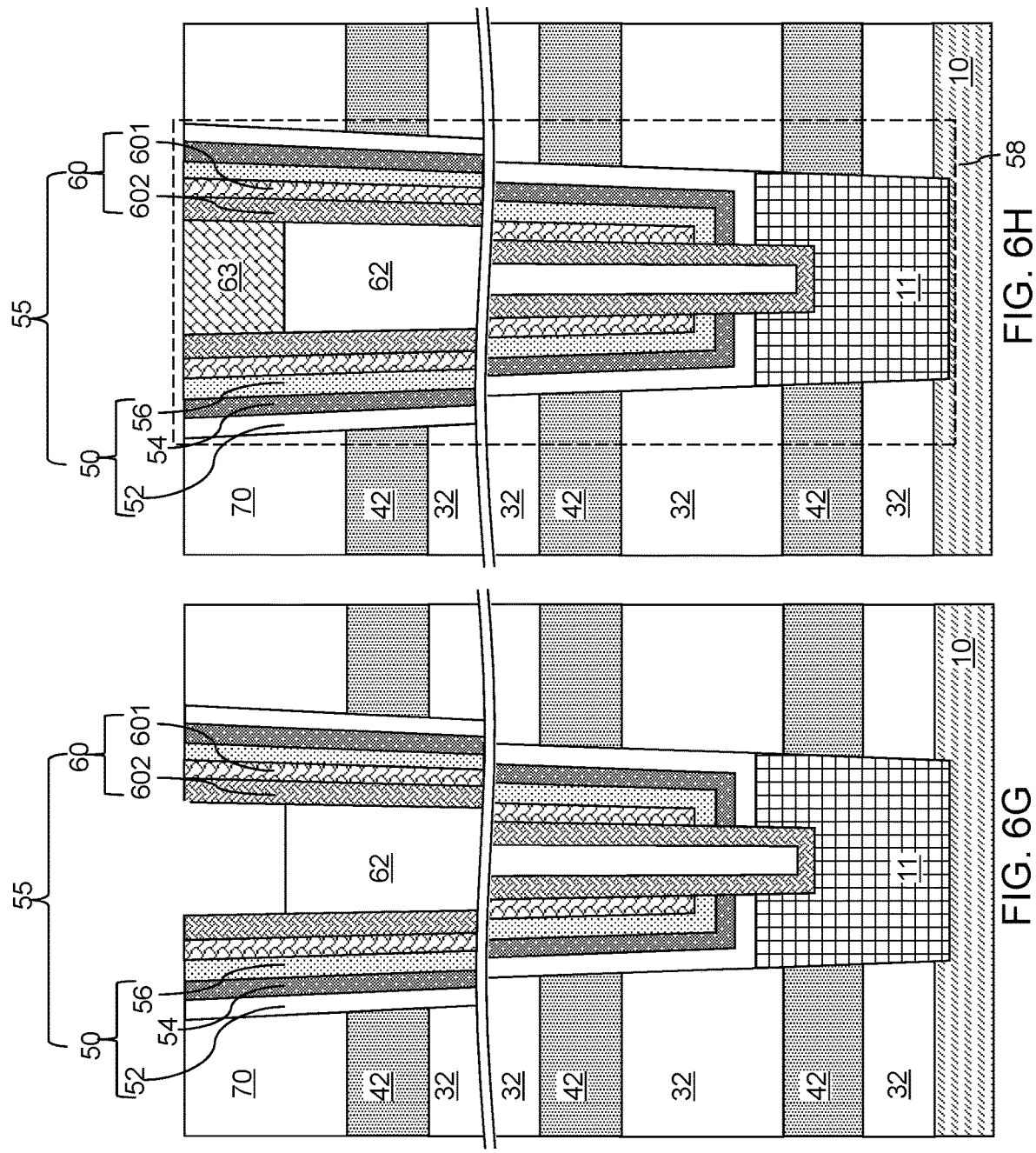

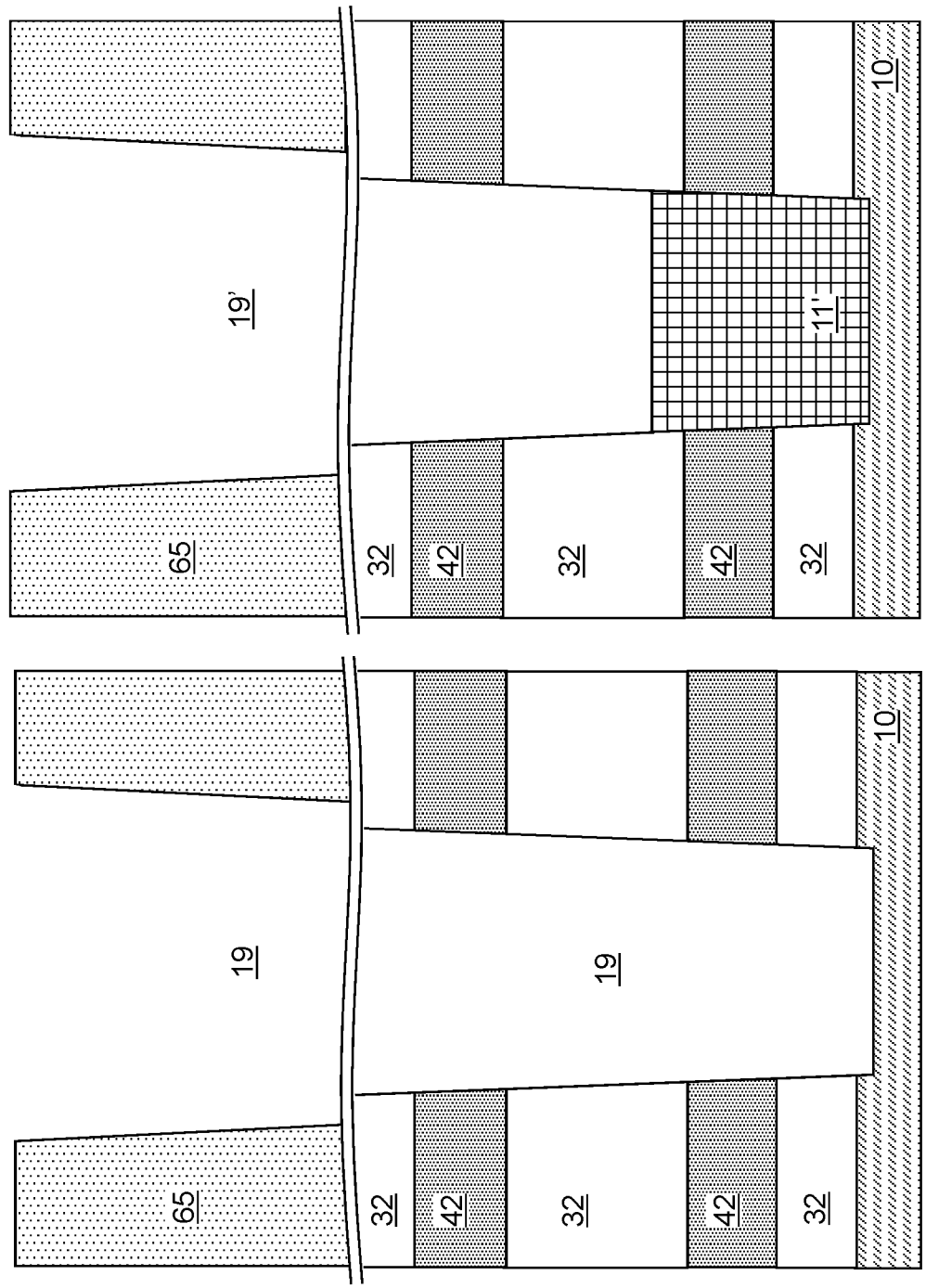

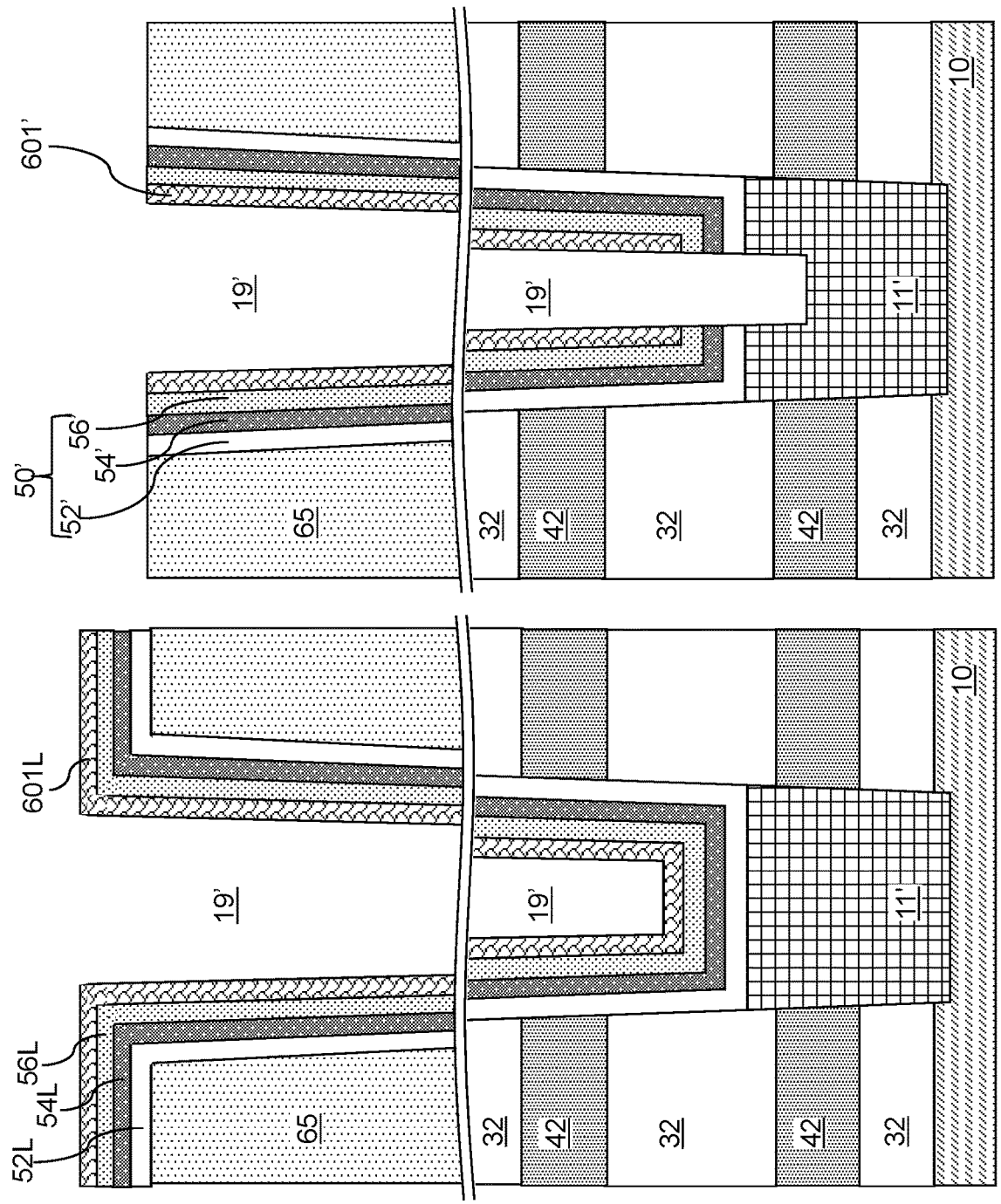

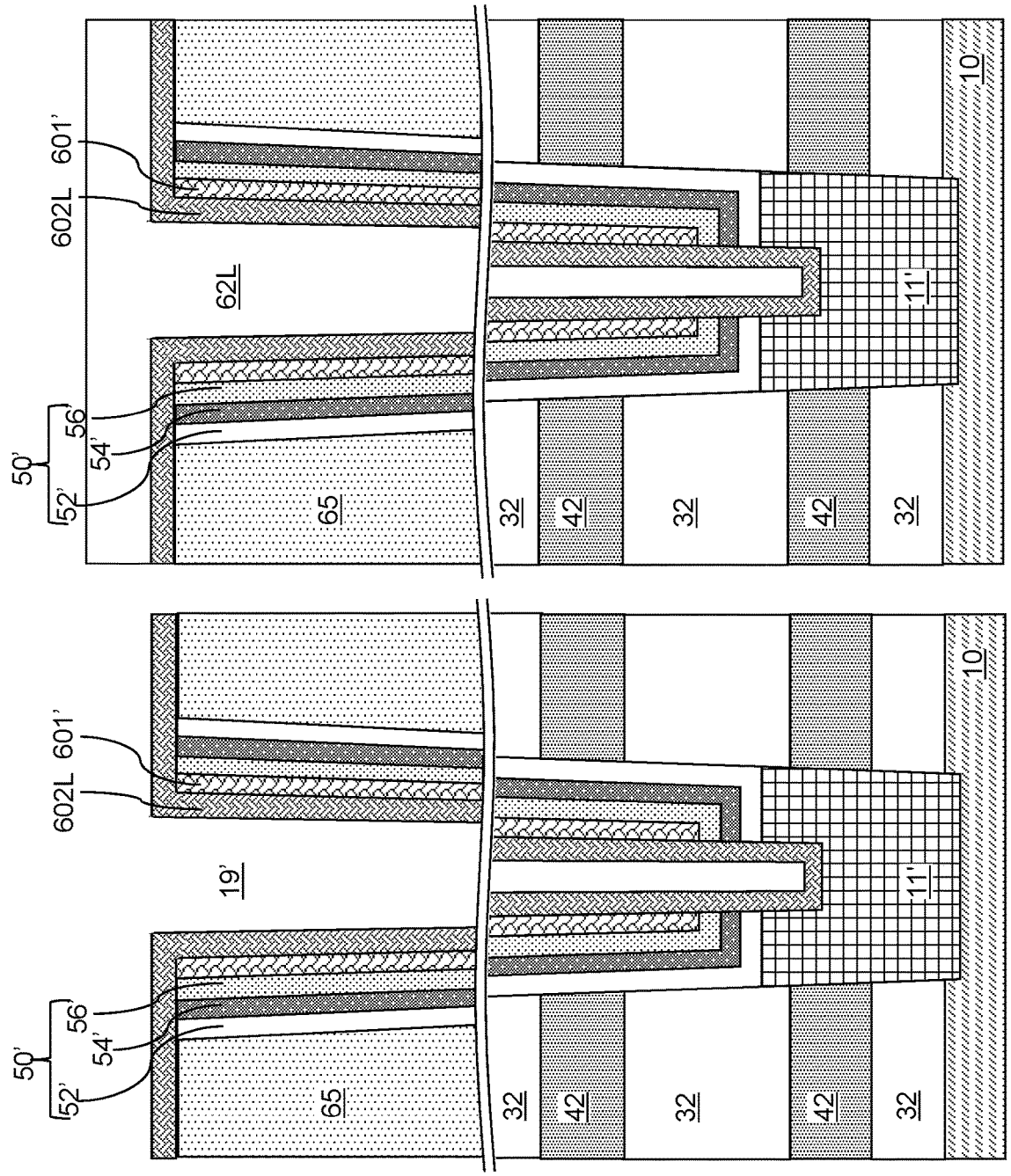

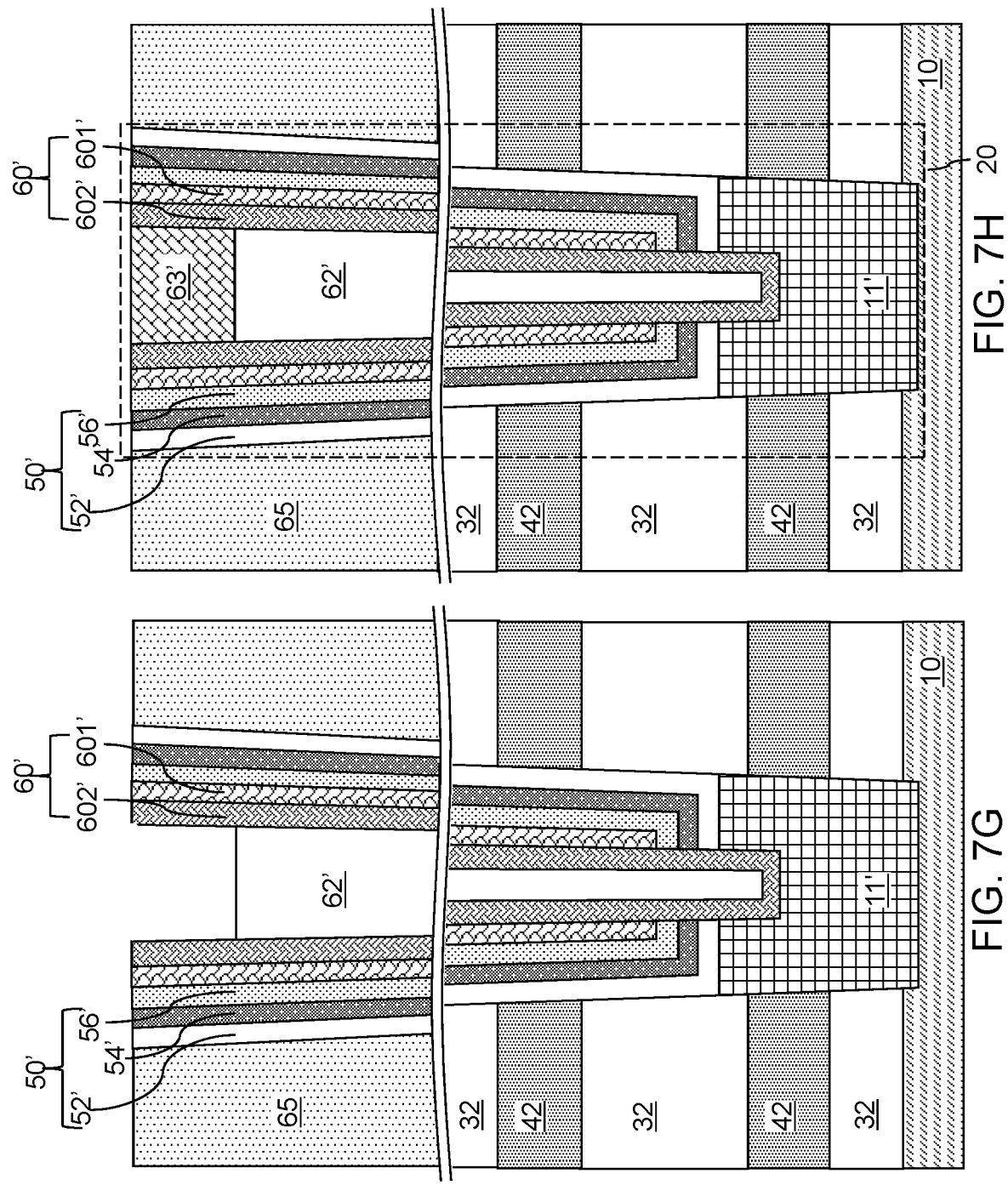

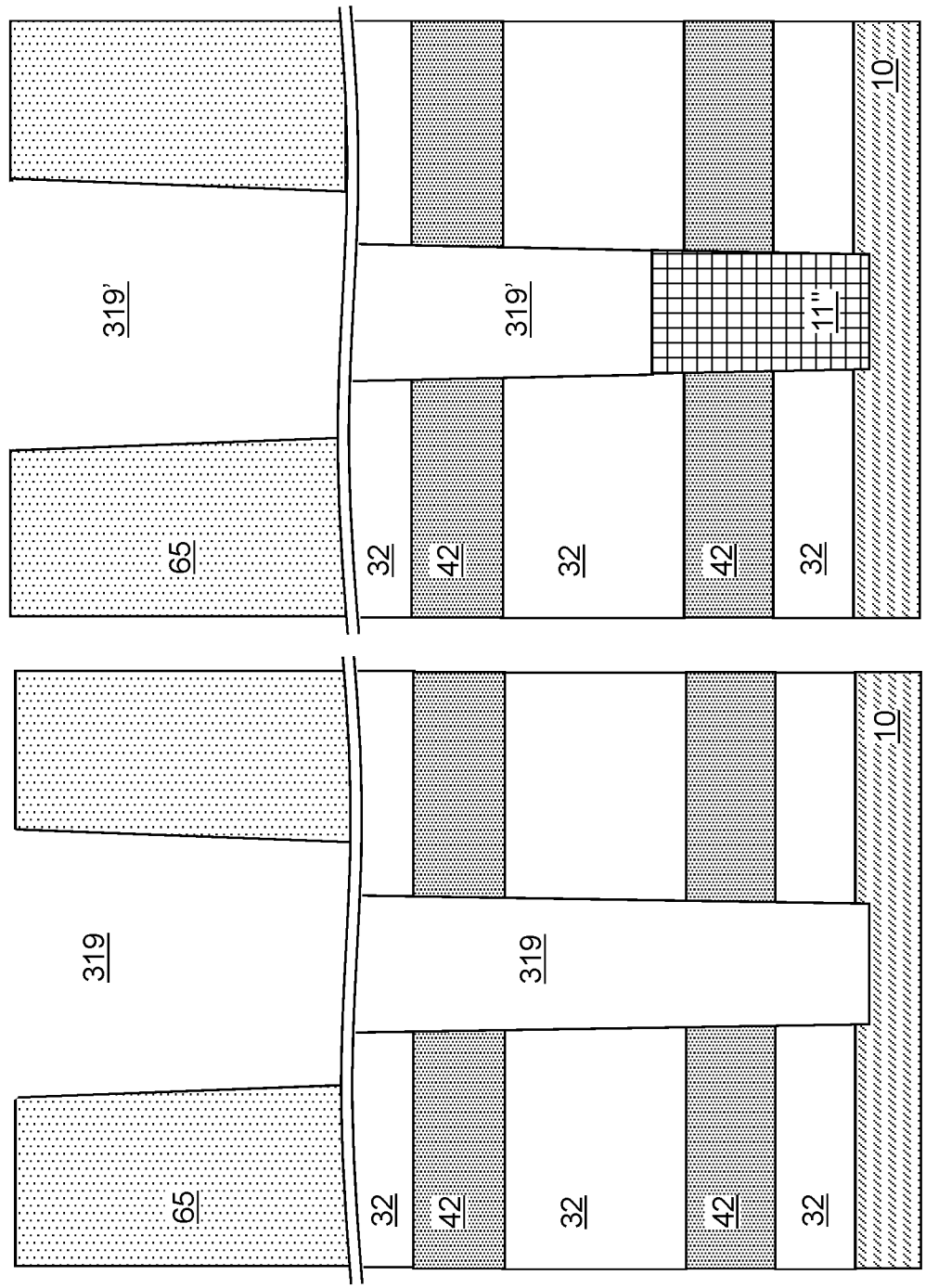

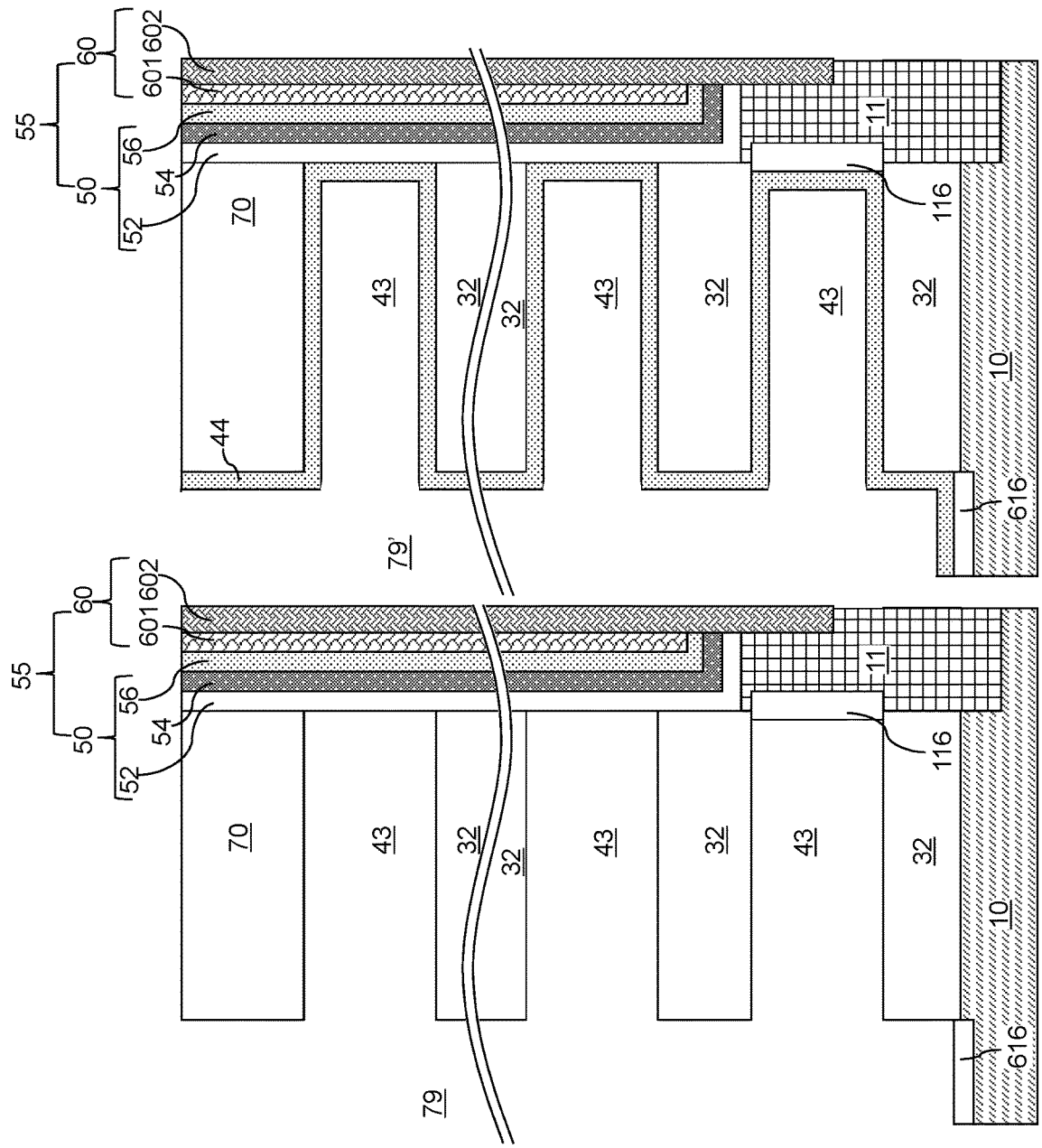

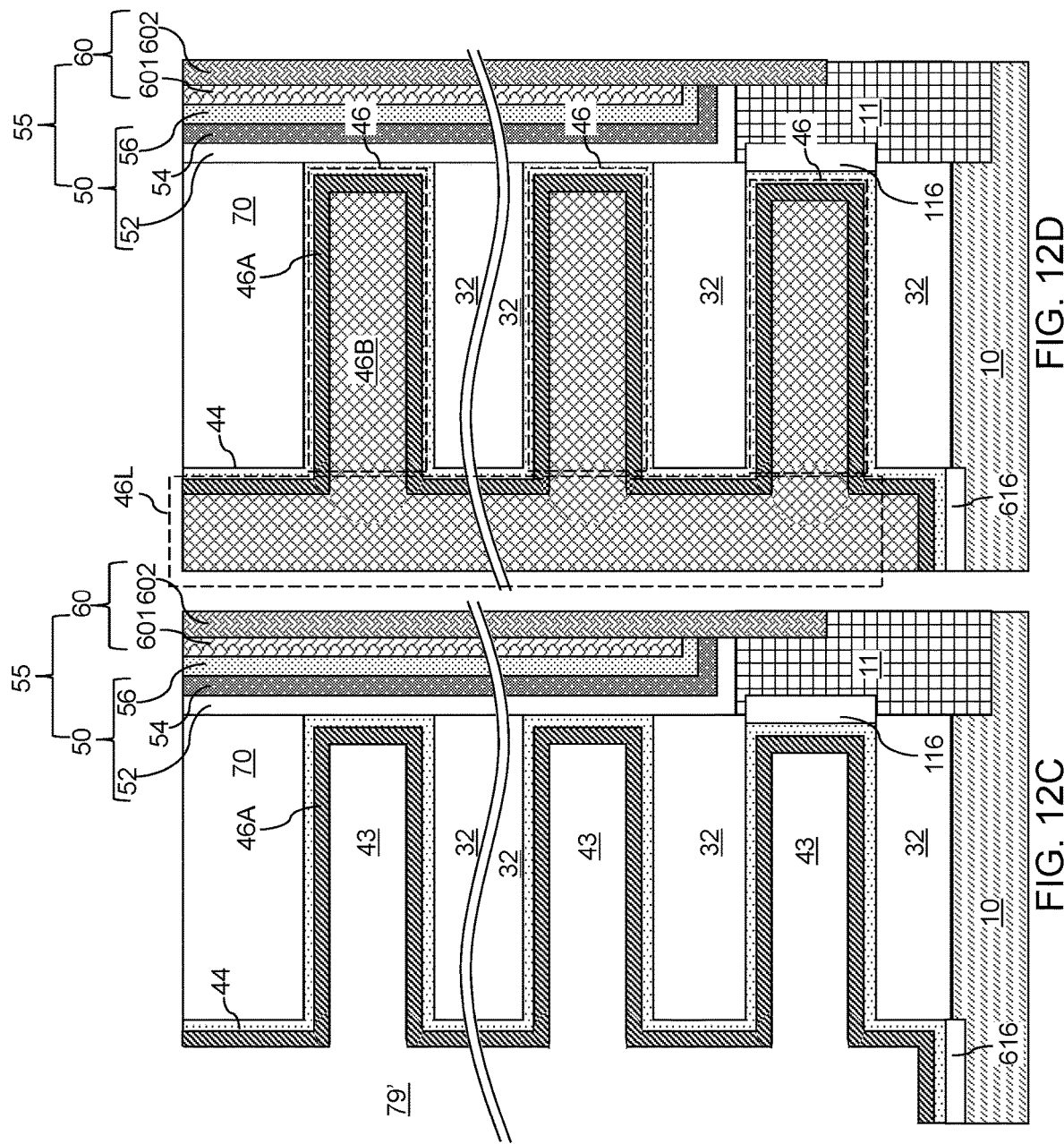

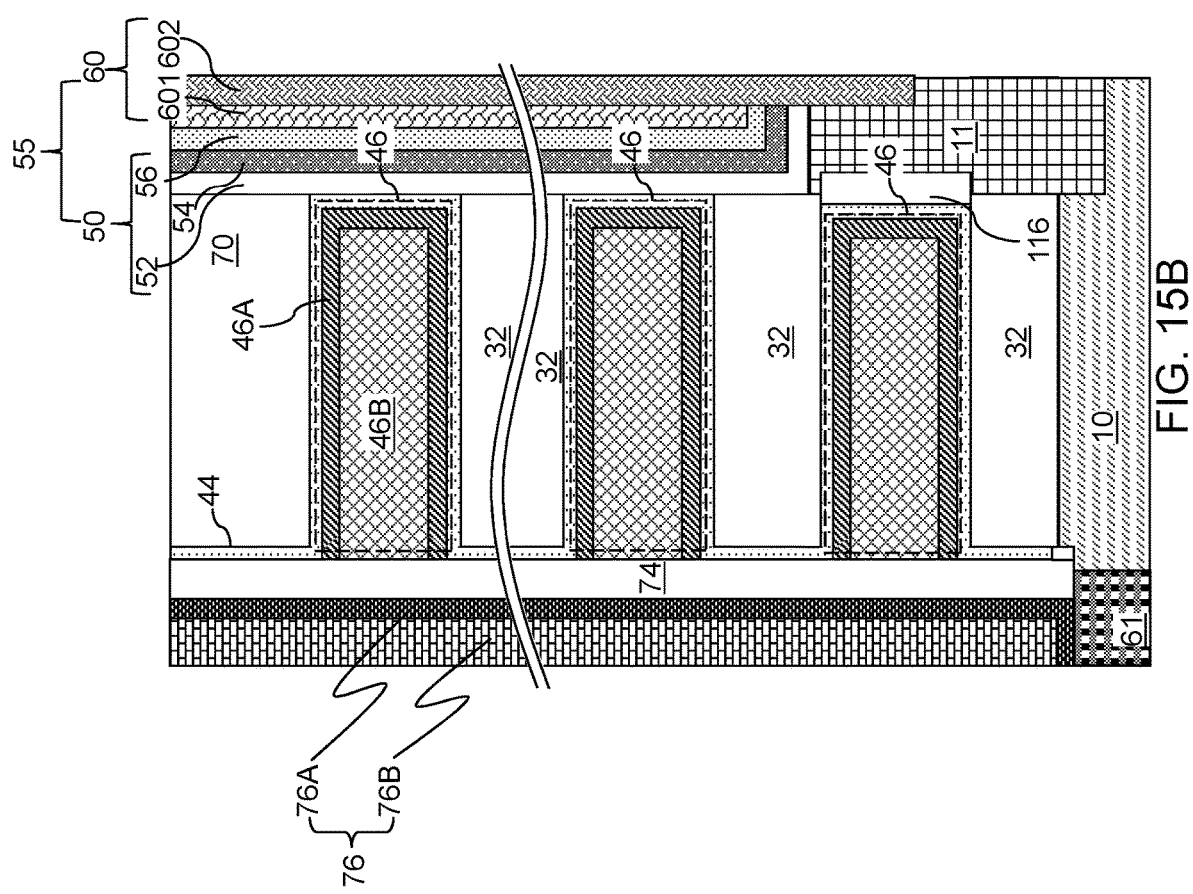

THREE-DIMENSIONAL MEMORY DEVICE CONTAINING ASYMMETRIC, DIFFERENT SIZE SUPPORT PILLARS AND METHOD FOR MAKING THE SAME

FIELD

The present disclosure relates generally to the field of semiconductor devices, and particular to a three-dimensional memory device containing asymmetric, different size support pillar structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. may

SUMMARY

According to an embodiment of the present disclosure, a three-dimensional memory device may be provided, which includes: an alternating stack of insulating layers and electrically conductive layers located over a substrate and comprising a staircase region having stepped surfaces; memory stack structures extending through the alternating stack, wherein each of the memory stack structures includes a memory film and a vertical semiconductor channel contacting an inner sidewall of the memory film; first support pillar structures vertically extending through the staircase region of the alternating stack and having a first maximum lateral dimension; and second support pillar structures vertically extending through the staircase region of the alternating stack, having a second maximum lateral dimension that is less than the first maximum lateral dimension, and interlaced with the first support pillar structures.

According to another embodiment of the present disclosure, a three-dimensional memory device comprises an alternating stack of insulating layers and electrically conductive layers located over a substrate and comprising a staircase region having stepped surfaces; memory stack structures extending through the alternating stack, wherein each of the memory stack structures comprises a memory film and a vertical semiconductor channel contacting an inner sidewall of the memory film; first and second backside trenches vertically extending through the alternating stack along a first horizontal direction; and first and second support pillar structures vertically extending through the staircase region of the alternating stack. The first support pillar structures are arranged in a plurality of row rows that are located between the first and second backside trenches; the plurality of rows comprise first and second boundary rows that extend along the first horizontal direction adjacent to the first and second backside trenches, and a least one inner row that extends along the first horizontal direction between the first and second boundary rows; the first support pillar structures have the same pitch in the first and second boundary rows and the at least one inner row; and the second support pillar structures are located between the first support pillar structures in the first and second boundary rows, but are not located in the at least one inner row to provide an asymmetric support pillar configuration.

According to another embodiment of the present disclosure, a method of forming a three-dimensional memory device is provided, which includes the steps of: forming an alternating stack of insulating layers and spacer material layers over a substrate; forming a staircase region having stepped surfaces by patterning the alternating stack; forming memory opening fill structures in a memory array region of the alternating stack and support pillar structures in the staircase region of the alternating stack, wherein each of the memory stack structures comprises a memory film and a vertical semiconductor channel, the support pillar structures comprise first support pillar structures and having a first maximum lateral dimension and second support pillar structures having a second maximum lateral dimension that is less than the first maximum lateral dimension and interlaced with the first support pillar structures; and replacing the sacrificial material layers with electrically conductive layers.

BRIEF DESCRIPTION OF THE DRAWINGS

FIGS. 6A-6H are sequential schematic vertical cross-sectional views of a memory opening within the exemplary structure during formation of a memory stack structure, a memory-opening dielectric core, and a drain region therein according to an embodiment of the present disclosure.

FIGS. 7A-7H are sequential schematic vertical cross-sectional views of a first support opening within the exemplary structure during formation of a first support pillar structure according to an embodiment of the present disclosure.

FIGS. 8A-8H are sequential schematic vertical cross-sectional views of a second support opening within the exemplary structure during formation of a second support pillar structure according to an embodiment of the present disclosure.

FIGS. 12A-12D are sequential vertical cross-sectional views of a region of the exemplary structure during formation of electrically conductive layers according to an embodiment of the present disclosure.

FIG. 15B is a magnified view of a region of the exemplary structure of FIG. 15A.

DETAILED DESCRIPTION

Figure 1:
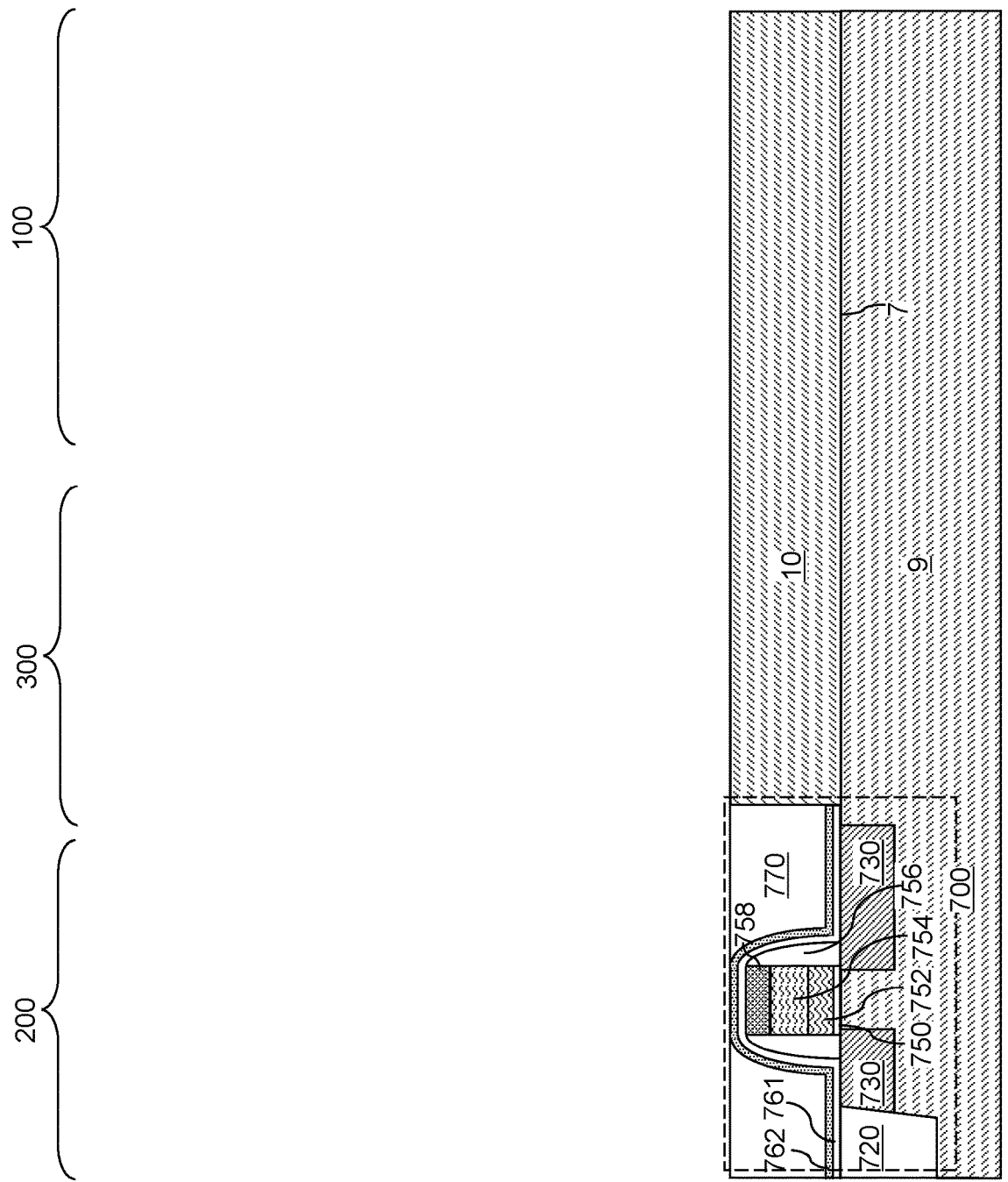
FIG. 1 is a schematic vertical cross-sectional view of an exemplary structure after formation of at least one peripheral device, and a semiconductor material layer according to an embodiment of the present disclosure.

Memory stack structure may be formed through a vertically alternating sequence of insulating layers and sacrificial material layers, and the sacrificial material layers may be subsequently replaced with electrically conductive layers. Support pillar structures may be employed in a staircase region to prevent collapse of the insulating layers during replacement of the sacrificial material layers with the electrically conductive layer. In some embodiments, the layout of the support pillar structures may be constrained due to potential electrical shorting with contact via structures that may be subsequently formed in the staircase region. Such electrical shorting should be avoided. Thus, the mechanical robustness of the vertically alternating stack during replacement of the sacrificial material layers with the electrically conductive layers may be limited by the constraint of minimum spacing between the support pillar structures and contact via structures that may be subsequently formed. The problem of reduced mechanical support due to design limitations on the support pillar structures may be more acute around areas of backside trenches that cut through the vertically alternating sequence. Thus, the embodiments of the present disclosure are directed to a three-dimensional memory device using asymmetric and/or different size support pillar structures and methods of manufacturing the same, the various aspects of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which may be used, for example, to fabricate a device structure containing vertical NAND memory devices. The exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device 700, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
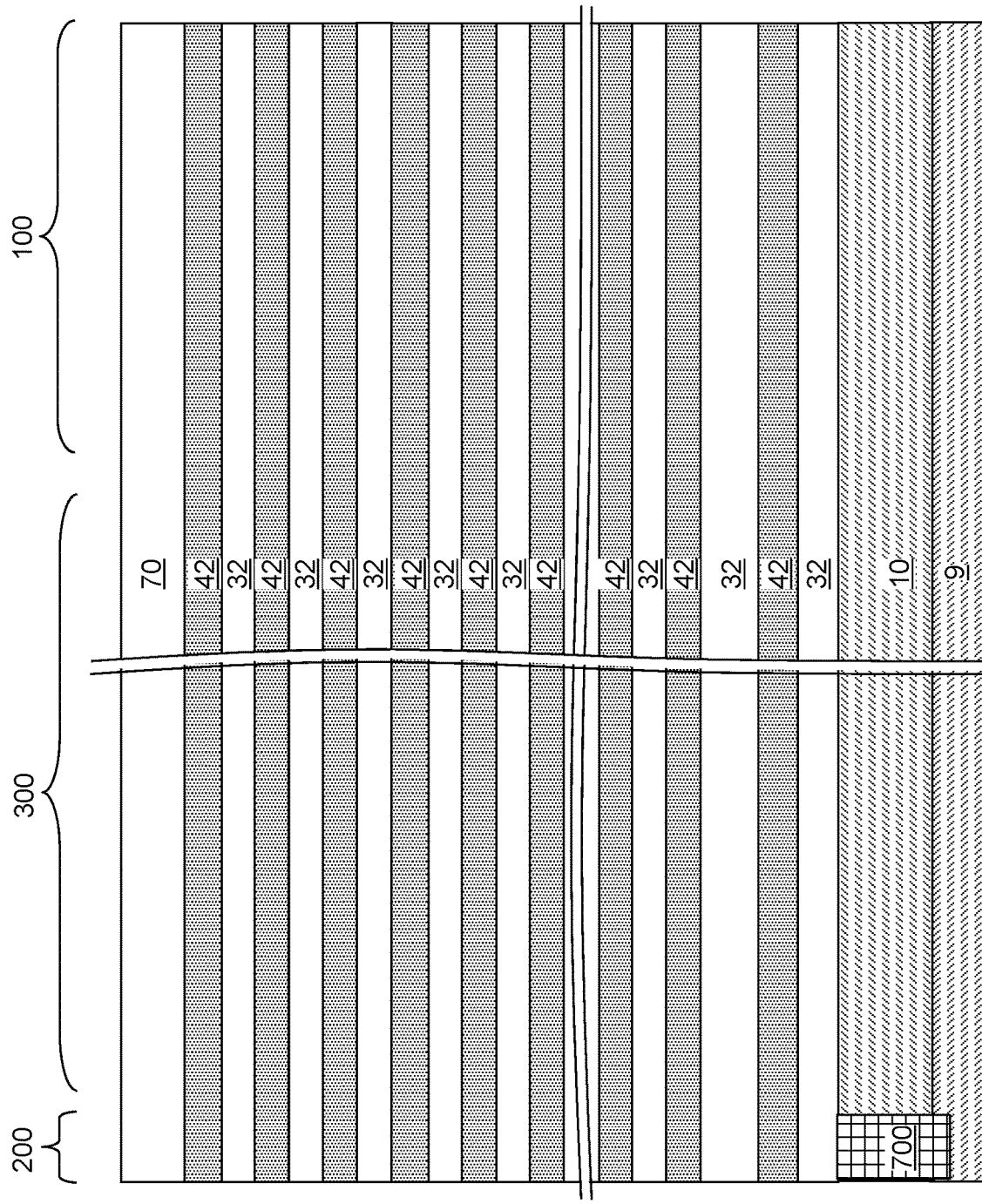
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which may be insulating layers 32) and second material layers (which may be sacrificial material layer 42) may be formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer 42. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
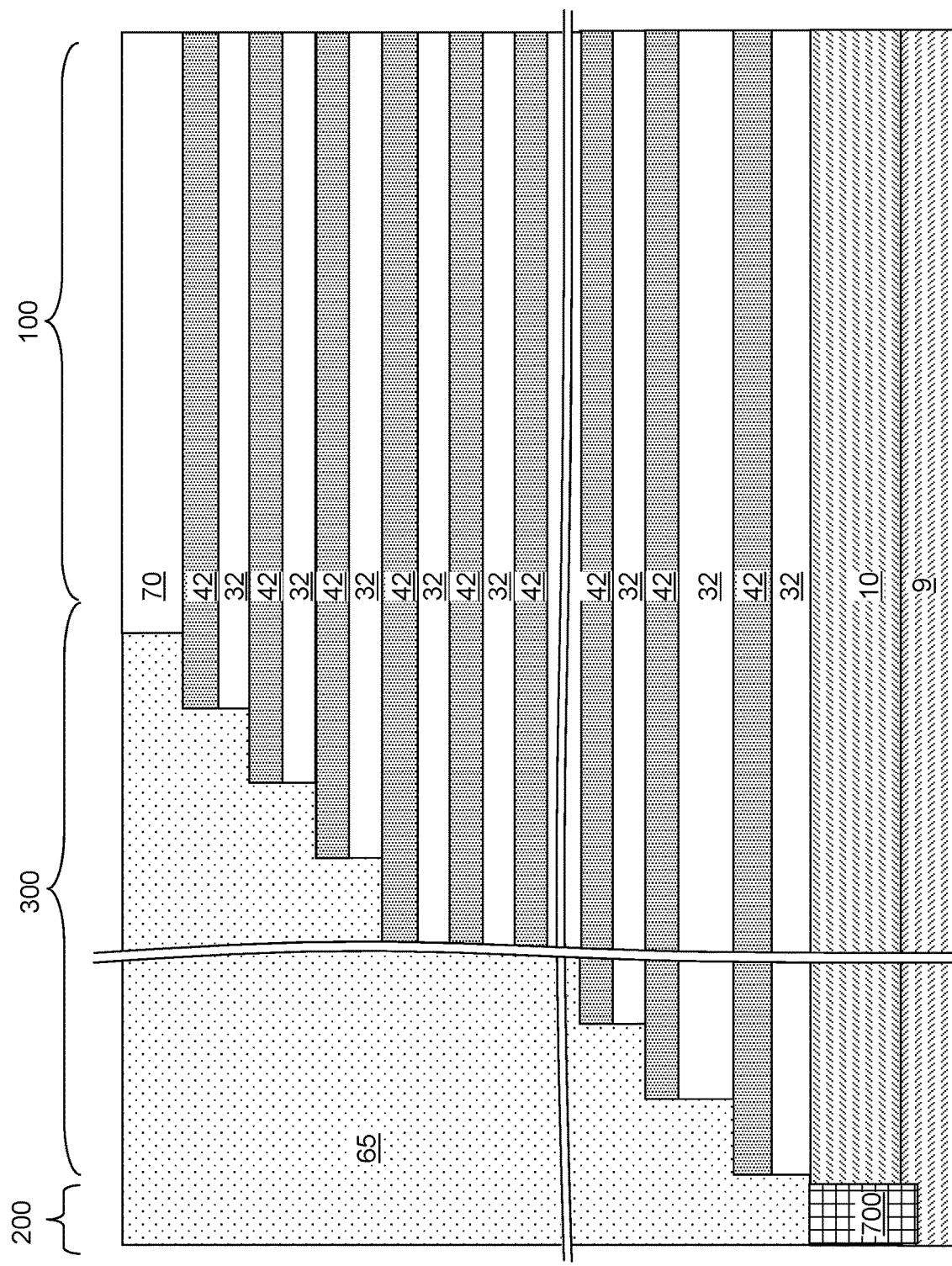
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed beginning at an edge of the peripheral region 200 of the alternating stack (32, 42), which is herein referred to as a terrace region or staircase region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region 300 includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4A:
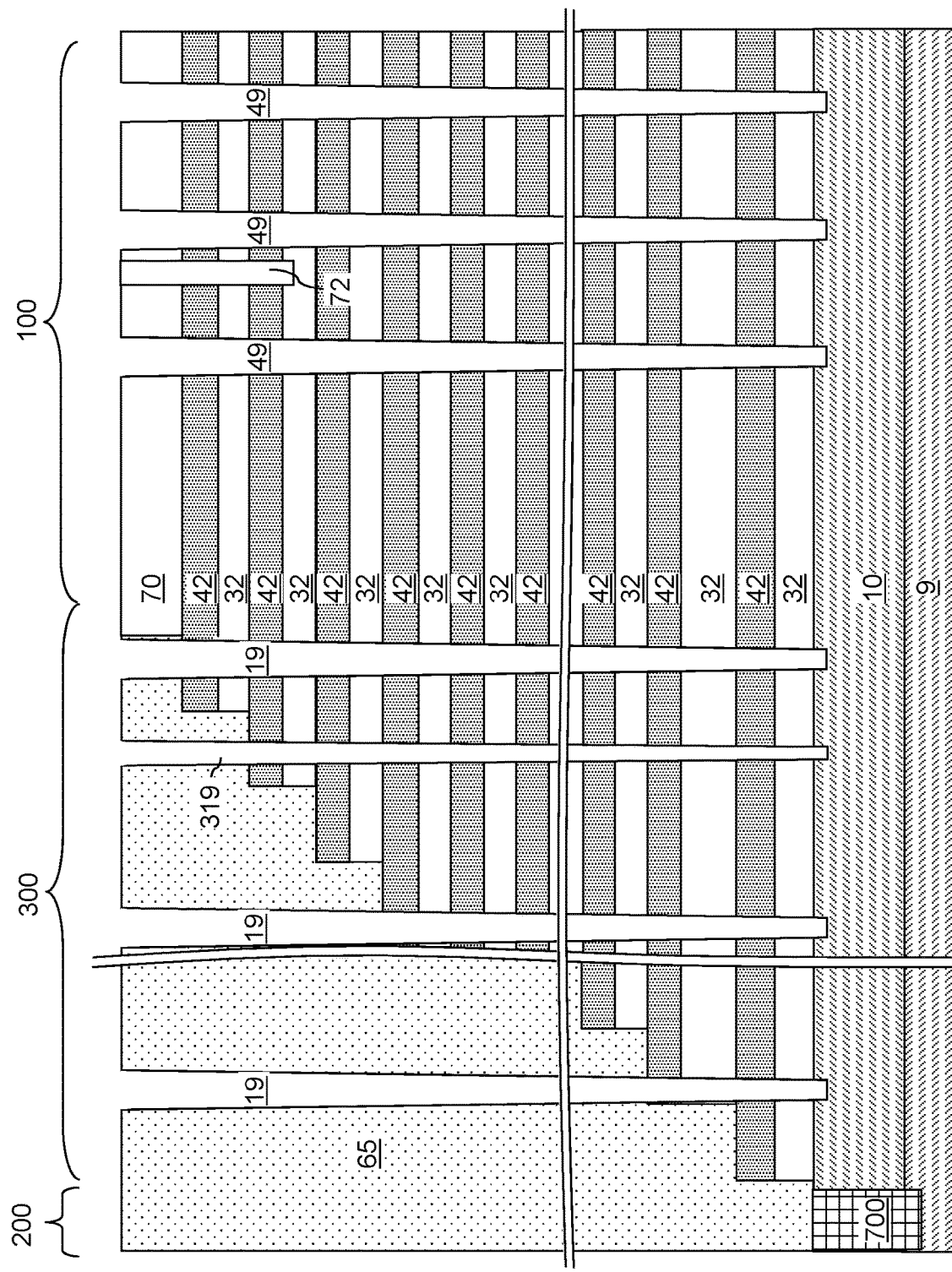
FIG. 4A is a schematic vertical cross-sectional view of the exemplary structure after formation of memory openings and support openings according to an embodiment of the present disclosure.
Figure 4B:
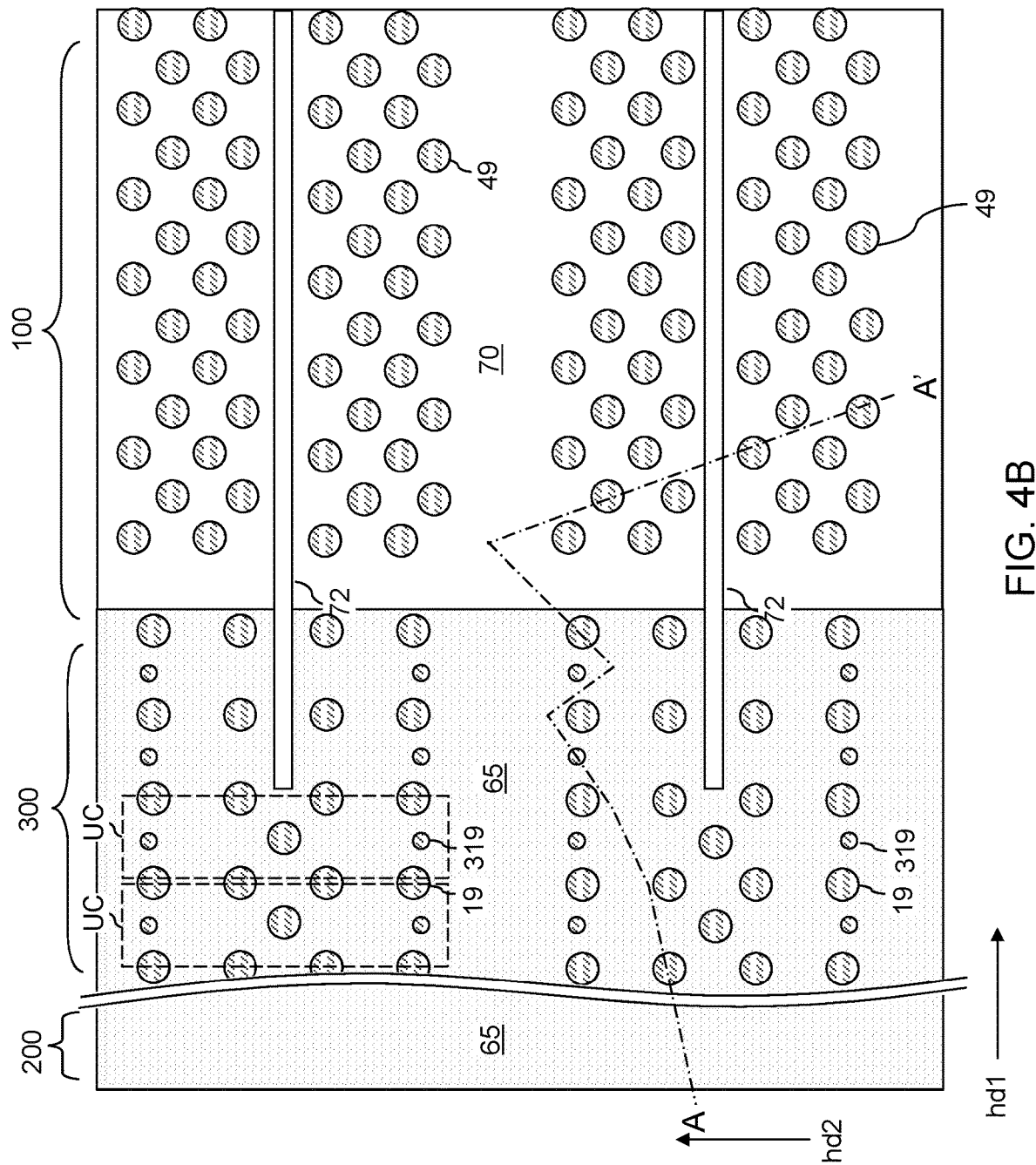
FIG. 4B is a top-down view of the exemplary structure of FIG. 4A. The vertical plane A-A' is the plane of the cross-section for FIG. 4A.
Figure 5B:
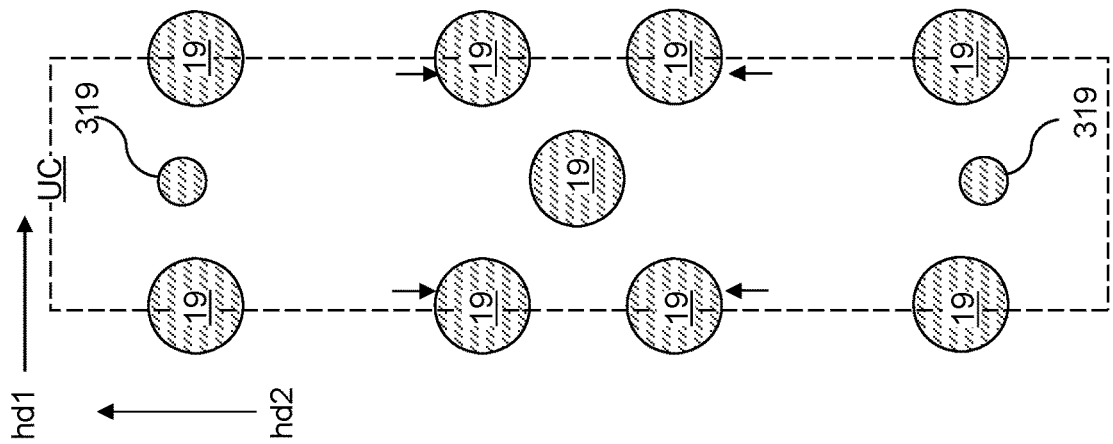
FIGS. 5A-5D are various layouts for a unit cell including at least two first support openings and at least one second support opening according an embodiment of the present disclosure.
Figure 5A:
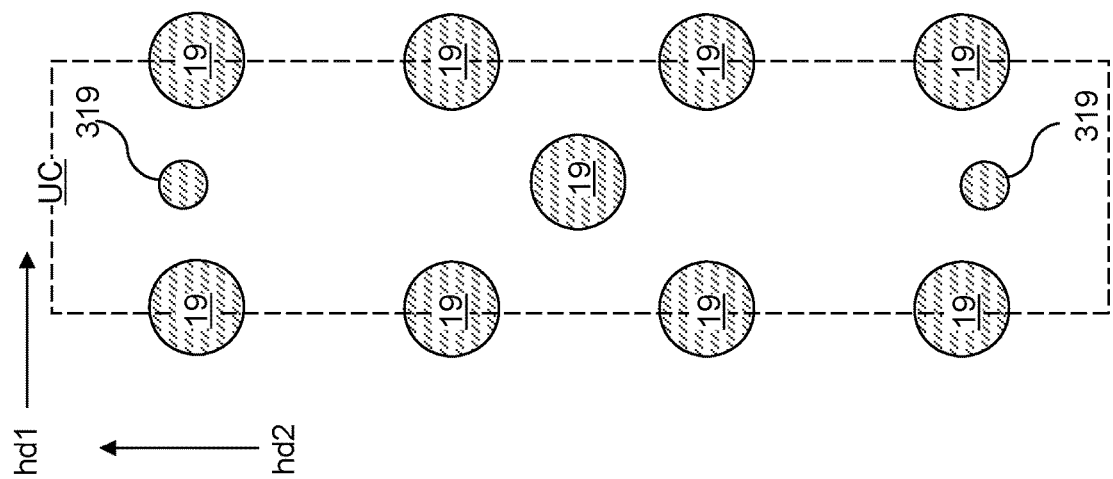

Referring to FIGS. 4A, 4B, and 5A, a lithographic material stack (not shown) including at least a photoresist layer may be formed over the insulating cap layer 70 and the retro-stepped dielectric material portion 65, and may be lithographically patterned to form openings therein. The openings include a first set of openings 49 formed over the memory array region 100 and a second set of openings (19, 319) formed over the staircase region 300. The second set of openings include first openings 19 having a first lateral dimension and second openings 319 having a second lateral dimension less than the first lateral dimension. In an illustrative example, each opening in the lithographic material stack may have a circular or elliptical horizontal cross-sectional shape.

The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings (19, 319). As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings (19, 319) are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings (19, 319) extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings (19, 319) may be substantially vertical, or may be tapered. The patterned lithographic material stack may be subsequently removed, for example, by ashing.

The memory openings 49 and the support openings (19, 319) may extend from the top surface of the alternating stack (32, 42) to at least the horizontal plane including the topmost surface of the semiconductor material layer 10. In an embodiment, an overetch into the semiconductor material layer 10 may be optionally performed after the top surface of the semiconductor material layer 10 is physically exposed at a bottom of each memory opening 49 and each support opening (19, 319). The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings (19, 319) may be coplanar with the topmost surface of the semiconductor material layer 10.

Each of the memory openings 49 and the support openings (19, 319) may include a sidewall (or a plurality of sidewalls) that extends substantially perpendicular to the topmost surface of the substrate. A two-dimensional array of memory openings 49 may be formed in the memory array region 100. A two-dimensional array of support openings (19, 319) may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings (19, 319) may be extend to a top surface of the substrate semiconductor layer 9.

The support openings (19, 319) include first support openings 19 having a first maximum lateral dimension and second support openings 319 having a second maximum lateral dimension. In case the support openings (19, 319) have circular or elliptical horizontal cross-sectional shapes, the first maximum lateral dimension may be the diameter or the major axis of the circular or elliptical shape of a respective support opening (19, 319) at the height of the maximum lateral extent. If the support openings (19, 319) have a respective cylindrical vertical cross-sectional profile, i.e., a profile in which the horizontal cross-sectional shape is invariant with a distance from the substrate (9, 10), the maximum lateral dimensions of the support openings (19, 319) may be the maximum lateral dimensions of horizontal cross-sectional shapes of the support openings (19, 319) at any height. If the support openings (19, 319) have a respective straight tapered vertical cross-sectional profile, i.e., a profile in which the straight sidewalls of the support openings (19, 319) are tapered, the maximum lateral dimensions of the support openings (19, 319) may be the maximum lateral dimensions of horizontal cross-sectional shapes of the support openings (19, 319) at the top of each of the support openings (19, 319). If the support openings (19, 319) have a respective bulging vertical cross-sectional profile, i.e., a profile in which the contoured sidewalls of the support openings (19, 319) provide bulging regions, the maximum lateral dimensions of the support openings (19, 319) may be the maximum lateral dimensions of horizontal cross-sectional shapes of the support openings (19, 319) at the bulging region of each of the support openings (19, 319).

The ratio of the first maximum lateral dimension to the second maximum lateral dimension may be in a range from 1.5 to 5, although lesser and greater ratios may also be used. Correspondingly, the ratio of the maximum horizontal cross-sectional area of each first support opening 19 to the maximum horizontal cross-sectional area of each second support opening 319 may be in a range from 2.25 to 25.

In one embodiment, a subset of the first support openings 19 may be arranged as a two-dimensional periodic array such as a rectangular array. The second support openings 319 may be placed at interstitial locations within the two-dimensional periodic array of the first support openings 19. Additional first support openings 19 may be provided at additional interstitial sites within the two-dimensional periodic array of the subset of the first support openings 19. In one embodiment, a rectangular array of the subset of the first support openings 19 may include rows that laterally extend along a first horizontal direction hd1, and laterally spaced apart along a second horizontal direction hd2 that is perpendicular to the first horizontal direction.

In one embodiment, multiple rectangular arrays of a respective subset of the first support openings 19 may be laterally spaced apart along the second horizontal direction hd2. In one embodiment, the memory openings 49 may be arranged as rows that laterally extend along the first horizontal direction hd1 and are laterally spaced part along the second horizontal direction hd2. The memory openings 49 may be arranged as multiple periodic arrays. In an embodiment, a first combination of at least one first periodic array of memory openings 49 and a first rectangular array of a subset of the first support openings 19 may be laterally spaced apart along the second horizontal direction hd2 from a second combination of at least one second periodic array of memory openings 49 and a second rectangular array of a subset of the first support openings 19 by an elongated region, in which a backside trench extending along the first horizontal direction hd1 is subsequently formed.

Each region including a rectangular array of a subset of the first support openings 19 may include multiple instances of a unit cell UC, which includes at least two first support openings 19 and at least one second support opening 319. The unit cell UC may be selected to provide areas that do not include support openings (19, 319) so that contact via structures may be subsequently formed therein. Second support openings 319 and optional additional first support openings 19 may be provided at interstitial locations within the rectangular array of a subset of the first support openings 19. Locations of the second support openings 319 and optional additional first support openings 19 may be selected to avoid overlap with backside trenches 72 to be subsequently formed. Thus, the second support openings 319 having the second maximum lateral dimension may be formed in regions that are proximal to areas in which the backside trenches 72 are to be subsequently formed, and the additional first support openings 19 may be formed in areas that are distal from the backside trenches.

In one embodiment, a unit cell UC may have a pair of short edges that are parallel to the first horizontal direction hd1 and a pair of long edges that are parallel to the second horizontal direction hd2. In an embodiment, a second opening 319 may be provided in proximity to each short edge of the unit cell UC, and an additional first support opening 19 may be provided in the middle of the unit cell UC. In an embodiment, first support openings 19 may be arranged along each long edge of the unit cell UC with a regular pitch along the second horizontal direction hd2. Each row of second support openings 319 may have a uniform intra-row pitch between neighboring pairs of second support openings 319 along the first horizontal direction hd1.

FIG. 5B illustrates an alternative configuration for a unit cell UC. In this case, a subset of the first support openings 19 may be shifted along the second horizontal direction hd2 to increase the lateral distance between the support openings (19, 319) and contact via structures to be subsequently formed in contact areas surrounded by the support openings (19, 319). Rows of first support openings 19 that laterally extend along the first horizontal direction hd1 may have a regular pitch, i.e., a uniform center-to-center distance between neighboring pairs of the first support openings 19 along the first horizontal direction hd1. In this case, all rows of first support openings 19 may have a uniform intra-row pitch between neighboring pairs of first support openings 19 along the first horizontal direction hd1. Each row of second support openings 319 may have a uniform intra-row pitch between neighboring pairs of second support openings 319 along the first horizontal direction hd1.

Figure 5C:
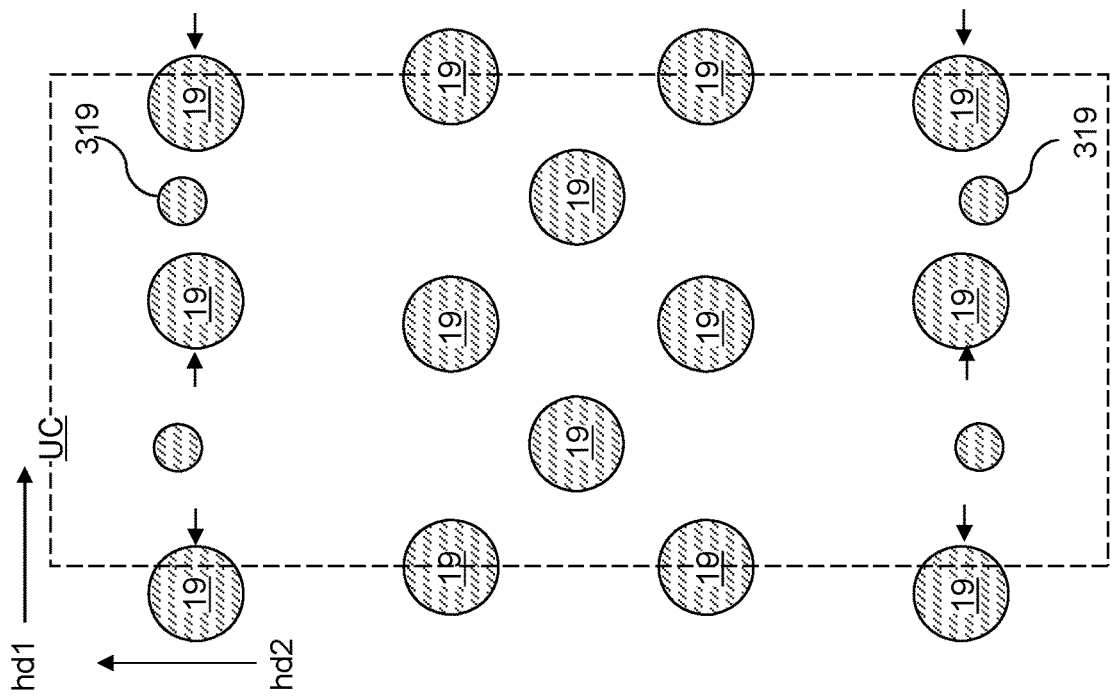

FIG. 5C illustrates another alternative embodiment configuration for the unit layout UL. At least one row of first support openings 19 may be modified to provide a periodic modulation of an inter-row pitch, i.e., a periodic modulation of the center-to-center distance between neighboring pairs of the first support openings 19 along the first horizontal direction hd1. In the illustrated example, two outer rows of first support openings 19 may have a uniform intra-row pitch between neighboring pairs of first support openings 19 along the first horizontal direction, and two inner rows of first support openings 19 may have a periodic modulation of an inter-row pitch that is repeated along the first horizontal direction hd1. Each row of second support openings 319 may have a uniform intra-row pitch between neighboring pairs of second support openings 319 along the first horizontal direction hd1.

Figure 5D:
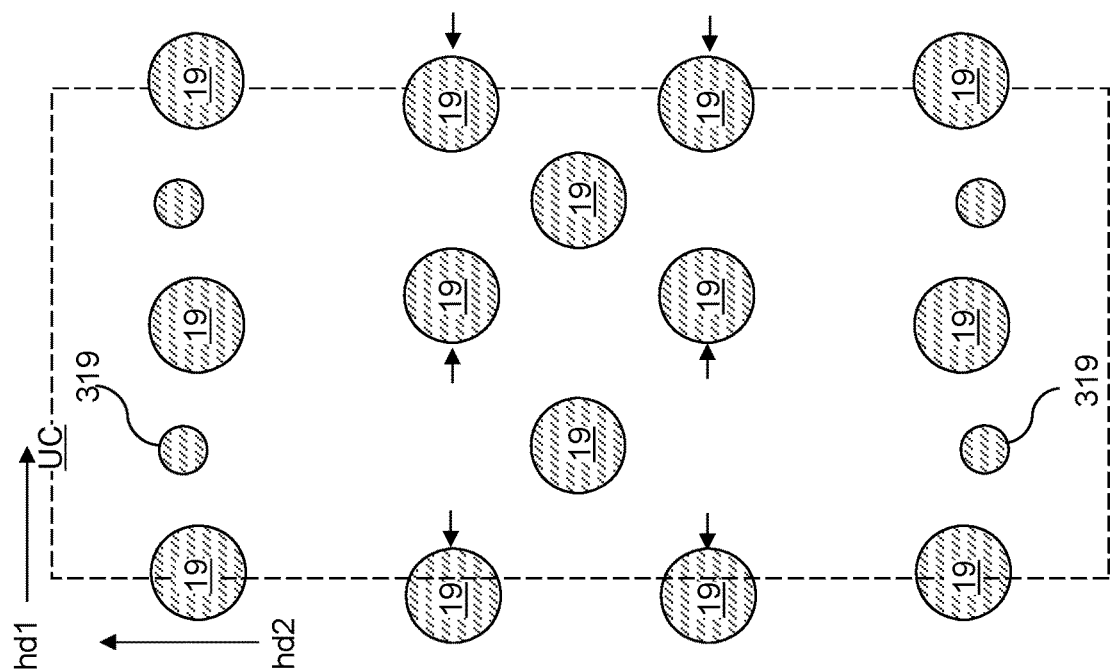

FIG. 5D illustrates yet another alternative embodiment configuration for the unit layout UL. At least one row of first support openings 19 may be modified to provide a periodic modulation of an inter-row pitch. In the illustrated example, two inner rows of first support openings 19 may have a uniform intra-row pitch between neighboring pairs of first support openings 19 along the first horizontal direction, and two outer rows of first support openings 19 may have a periodic modulation of an inter-row pitch that is repeated along the first horizontal direction hd1. Each row of second support openings 319 may have a uniform intra-row pitch between neighboring pairs of second support openings 319 along the first horizontal direction hd1.

FIGS. 6A-8H illustrate various vertical cross-sectional views of a respective region of the exemplary structure during formation of memory opening fill structures that are formed in the memory openings 49, first support pillar structures that are formed in the first support openings 19, and second support pillar structures that are formed in the second support openings 319. FIGS. 6A-6H are sequential schematic vertical cross-sectional views of a memory opening 49 within the exemplary structure during formation of a memory opening fill structure therein. FIGS. 7A-7H are sequential schematic vertical cross-sectional views of a first support opening within the exemplary structure during formation of a first support pillar structure therein. FIGS. 8A-8H are sequential schematic vertical cross-sectional views of a second support opening within the exemplary structure during formation of a second support pillar structure therein.

Referring to FIGS. 6A, 7A, and 8A, a memory opening 49, a first support opening 19, and a second support opening 319 are respectively illustrated at the processing steps of FIGS. 4A, 4B, and 5A-5D. Each memory opening 49 extends through the insulating cap layer 70, the alternating stack (32, 42), and optionally into an upper portion of the semiconductor material layer 10. Each support opening (19, 319) may extend through the retro-stepped dielectric material portion 65, a subset of layers in the alternating stack (32, 42), and optionally through the upper portion of the semiconductor material layer 10. The recess depth of the bottom surface of each memory opening 49 and each support opening (19, 319) with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIGS. 6B, 7B, and 8B, a semiconductor material having a doping of a same conductivity type as the semiconductor material layer 10 may be selectively grown from the physically exposed surfaces of the semiconductor material layer 10. In case the semiconductor material layer 10 includes a single crystalline semiconductor material (such as single crystalline silicon), each deposited semiconductor material portion may include a single crystalline semiconductor material in epitaxial alignment with the single crystalline semiconductor material of the semiconductor material layer 10. In case the semiconductor material layer 10 includes a polycrystalline semiconductor material (such as polysilicon), each deposited semiconductor material portion may include a polycrystalline semiconductor material. In one embodiment, a selective epitaxy process or a selective semiconductor deposition process may be used.

A pedestal channel portion 11 may be formed at the bottom portion of each memory opening 49, a first pedestal semiconductor portion 11' may be formed at the bottom of each first support opening 19, and a second pedestal semiconductor portion 11" may be formed at the bottom of each second support opening 319. In one embodiment, the top surface of each pedestal channel portion 11, each first pedestal semiconductor portion 11', and each second pedestal semiconductor portion 11" may be formed above a horizontal plane including the top surface of a bottommost sacrificial material layer 42. In this case, a source select gate electrode may be subsequently formed by replacing the bottommost sacrificial material layer 42 with a conductive material layer.

The pedestal channel portion 11 may be a portion of a transistor channel that extends between a source region to be subsequently formed in the substrate (9, 10) and a drain region to be subsequently formed in an upper portion of the memory opening 49. The first pedestal semiconductor portions 11' and the second pedestal semiconductor portions 11" are dummy components that are electrically inactive. A memory cavity 49' is present in the unfilled portion of each memory opening 49 above a pedestal channel portion 11. A first support cavity 19' is present in the unfilled portion of each first support opening 19 above a first pedestal semiconductor portion 11'. A second support cavity 319' is present in the unfilled portion of each second support opening 319 above a second pedestal semiconductor portion 11".

In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 8C:
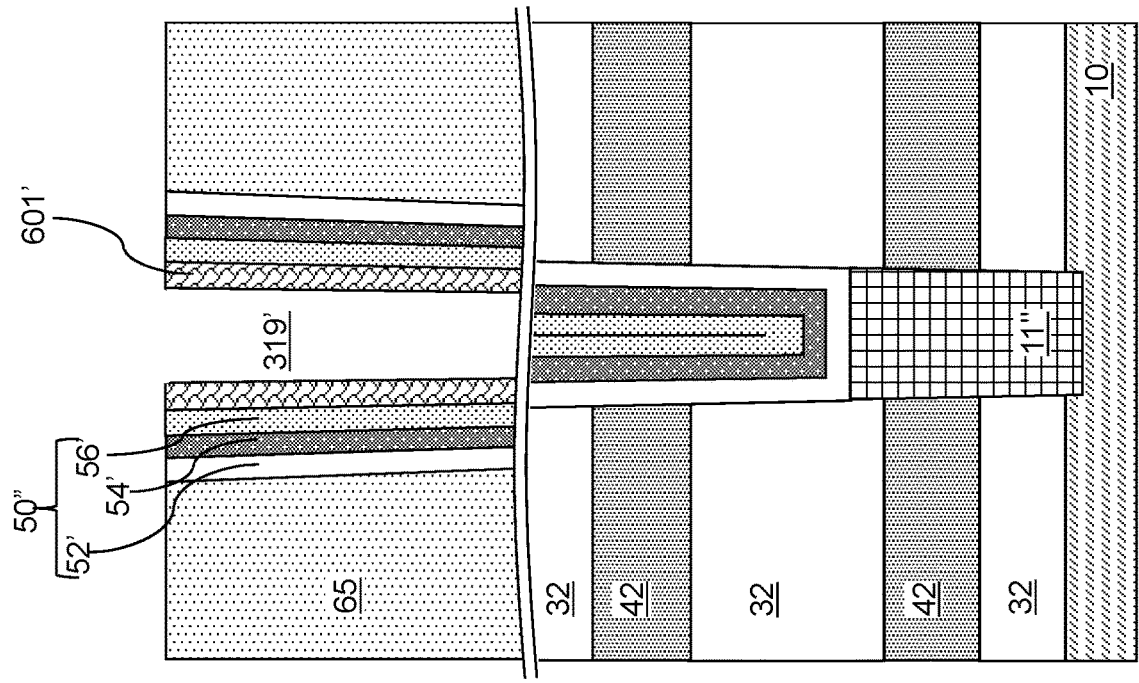

Referring to FIGS. 6C, 7C, and 8C, a continuous layer stack including a continuous blocking dielectric material layer 52L, a continuous charge storage material layer 54L, and a continuous tunneling dielectric material layer 56L may be deposited in each of the memory openings 49, first support openings 19, and the second support openings 319.

The continuous blocking dielectric material layer 52L may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In an embodiment, the continuous blocking dielectric material layer 52L may include a dielectric metal oxide having a dielectric constant greater than 7.9, i.e., having a dielectric constant greater than the dielectric constant of silicon nitride. In one embodiment, the continuous blocking dielectric material layer 52L includes aluminum oxide. In one embodiment, the continuous blocking dielectric material layer 52L may include multiple dielectric metal oxide layers having different material compositions.

Alternatively, or additionally, the continuous blocking dielectric material layer 52L may include a dielectric semiconductor compound such as silicon oxide, silicon oxynitride, silicon nitride, or a combination thereof. In one embodiment, the continuous blocking dielectric material layer 52L may include silicon oxide. In this case, the dielectric semiconductor compound of the continuous blocking dielectric material layer 52L may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the continuous blocking dielectric material layer 52L may be omitted, and a backside blocking dielectric layer may be formed after formation of backside recesses on surfaces of memory films to be subsequently formed.

Subsequently, the continuous charge storage material layer 54L may be formed. In an embodiment, the continuous charge storage material layer 54L may be a continuous layer or patterned discrete portions of a charge trapping material including a dielectric charge trapping material, which may be, for example, silicon nitride. Alternatively, the continuous charge storage material layer 54L may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the continuous charge storage material layer 54L includes a silicon nitride layer. In one embodiment, the sacrificial material layers 42 and the insulating layers 32 may have vertically coincident sidewalls, and the continuous charge storage material layer 54L may be formed as a single continuous layer.

In another embodiment, the sacrificial material layers 42 may be laterally recessed with respect to the sidewalls of the insulating layers 32, and a combination of a deposition process and an anisotropic etch process may be used to divide the continuous charge storage material layer 54L into a plurality of memory material portions that are vertically spaced apart. While the present disclosure is described using an embodiment in which the continuous charge storage material layer 54L is a single continuous layer, embodiments are expressly contemplated herein in which the continuous charge storage material layer 54L is replaced with a plurality of memory material portions (which may be charge trapping material portions or electrically isolated conductive material portions) that are vertically spaced apart. The continuous charge storage material layer 54L may be formed, for example, by chemical vapor deposition (CVD), atomic layer deposition (ALD), physical vapor deposition (PVD), or any suitable deposition technique for storing electrical charges therein. The thickness of the continuous charge storage material layer 54L may be in a range from 2 nm to 20 nm, although lesser and greater thicknesses may also be used.

The continuous tunneling dielectric material layer 56L includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric material layer 56L may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric material layer 56L may include a stack of a first silicon oxide layer, a silicon oxynitride layer, and a second silicon oxide layer, which is commonly known as an ONO stack. In one embodiment, the continuous tunneling dielectric material layer 56L may include a silicon oxide layer that is substantially free of carbon or a silicon oxynitride layer that is substantially free of carbon. The thickness of the continuous tunneling dielectric material layer 56L may be in a range from 2 nm to 20 nm, although lesser and greater thicknesses may also be used.

In one embodiment, the memory openings 49 and the first support openings 19 have a respective minimum lateral dimension (such as a diameter of a circle or a minor axis of an ellipse) that is greater than the thickness of the continuous layer stack (52L, 54L, 56L) at the horizontal plane including the top surfaces of the pedestal channel portion 11 and the first pedestal semiconductor portions 11'. In this case, the memory openings 49 and the first support openings 19 may include a respective horizontal portion of the continuous tunneling dielectric material layer 56L above a pedestal channel portion 11 or above a first pedestal semiconductor portion 11'. In one embodiment, the second support openings 319 have a respective minimum lateral dimension (such as a diameter of a circle or a minor axis of an ellipse) that is less than the thickness of the continuous layer stack (52L, 54L, 56L) at the horizontal plane including the top surfaces of the second pedestal semiconductor portions 11". In this case, bottom portions of the second support openings 319 may be filled with two vertically extending portions of a dielectric material layer within the continuous layer stack (52L, 54L, 56L) (such as vertically extending portions of the continuous tunneling dielectric material layer 56L) with a respective vertically extending seam of the dielectric material layer.

A first continuous semiconductor channel material layer 601L may be optionally deposited over the continuous tunneling dielectric material layer 56L. The optional first continuous semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first continuous semiconductor channel material layer 601L includes amorphous silicon or polysilicon. The first continuous semiconductor channel material layer 601L may be formed by a conformal deposition method such as low pressure chemical vapor deposition (LPCVD). The thickness of the first continuous semiconductor channel material layer 601L may be in a range from 2 nm to 10 nm, although lesser and greater thicknesses may also be used. A memory cavity 49' is formed in the volume of each memory opening 49 that is not filled with the deposited material layers (52L, 54L, 56L, 601L).

In case the bottom portions of the second support openings 319 are filled with two vertically extending portions of a dielectric material layer within the continuous layer stack (52L, 54L, 56L), the first continuous semiconductor channel material layer 601L may be vertically spaced from an underlying second pedestal semiconductor portion 11" by a vertical separation distance that is greater than the thickness of the continuous layer stack (52L, 54L, 56L). Further, a bottom portion of the first continuous semiconductor channel material layer 601L may fill a bottom region of a remaining portion of the second support cavity 319' with a vertically extending seam.

Figure 8D:
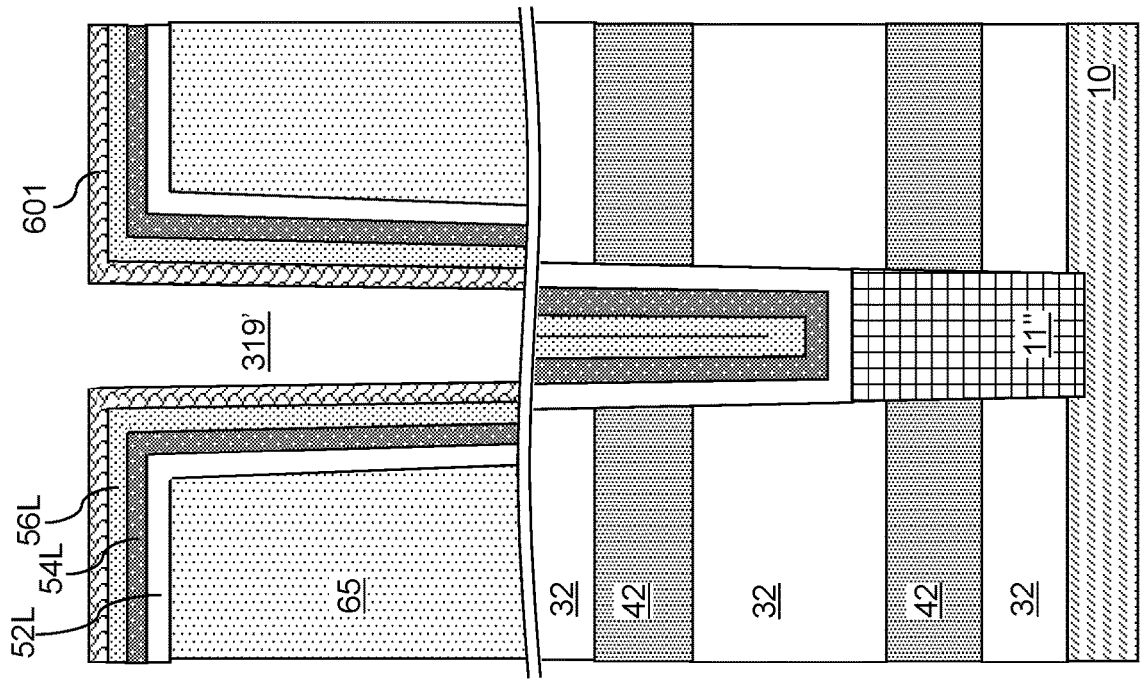

Referring to FIGS. 6D, 7D, and 8D, the optional first continuous semiconductor channel material layer 601L, the continuous tunneling dielectric material layer 56L, the continuous charge storage material layer 54L, and the continuous blocking dielectric material layer 52L are sequentially anisotropically etched using at least one anisotropic etch process. The portions of the first continuous semiconductor channel material layer 601L, the continuous tunneling dielectric material layer 56L, the continuous charge storage material layer 54L, and the continuous blocking dielectric material layer 52L located above the top surface of the insulating cap layer 70 may be removed by the at least one anisotropic etch process. Further, the horizontal portions of the first continuous semiconductor channel material layer 601L, the continuous tunneling dielectric material layer 56L, the continuous charge storage material layer 54L, and the continuous blocking dielectric material layer 52L at a bottom of each memory cavity 49' may be removed to form openings in remaining portions thereof. Each of the first continuous semiconductor channel material layer 601L, the continuous tunneling dielectric material layer 56L, the continuous charge storage material layer 54L, and the continuous blocking dielectric material layer 52L may be etched by a respective anisotropic etch process using a respective etch chemistry, which may, or may not, be the same for the various material layers.

Each remaining portion of the first continuous semiconductor channel material layer 601L in a memory opening 49 constitutes a first semiconductor channel layer 601 having a tubular configuration. Each remaining portion of the continuous tunneling dielectric material layer 56L in a memory opening 49 constitutes a tunneling dielectric layer 56. Each remaining portion of the continuous charge storage material layer 54L in a memory opening 49 constitutes a charge storage layer 54. Each remaining portion of the continuous blocking dielectric material layer 52L in a memory opening 49 constitutes a blocking dielectric layer 52. The charge storage layers 54 may comprise a charge trapping material or a floating gate material. In one embodiment, each charge storage layer 54 may include a vertical stack of charge storage regions that store electrical charges upon programming. In one embodiment, each portion of the charge storage layer 54 adjacent to the sacrificial material layers 42 constitutes a charge storage region. Remaining portions of the continuous layer stack (52L, 54L, 56L) in the memory openings 49 constitute memory films 50. Each memory film 50 is a combination of a blocking dielectric layer 52, a charge storage layer 54, and a tunneling dielectric layer 56 located within a memory opening 49.

Each remaining portion of the first continuous semiconductor channel material layer 601L in a first support opening 19 constitutes an outer semiconductor material portion 601' having a tubular configuration. Each remaining portion of the continuous blocking dielectric material layer 52L in a first support opening 19 constitutes an outer dielectric layer 52' having a same composition and a same thickness as a blocking dielectric layer 52. Each remaining portion of the continuous charge storage material layer 54L in a first support opening 19 constitutes a middle dielectric layer 54' having a same composition and a same thickness as a charge storage layer 54. Each remaining portion of the continuous tunneling dielectric material layer 56L in a first support opening 19 constitutes an inner dielectric layer 56' having as same composition and a same thickness as a tunneling dielectric layer 56. Remaining portions of the continuous layer stack (52L, 54L, 56L) in the first support openings 19 constitute first dielectric layer stacks 50'. Each first dielectric layer stack 50' is a combination of an outer dielectric layer 52', a middle dielectric layer 54', and an inner dielectric layer 56' located within a respective first support opening 19.

Each remaining portion of the first continuous semiconductor channel material layer 601L in a second support opening 319 constitutes an outer semiconductor material portion 601', which may have an inverted conical configuration with, or without, an inverted conical hollow therein. Each remaining portion of the continuous blocking dielectric material layer 52L in a second support opening 319 constitutes an outer dielectric layer 52' having a same composition and a same thickness as a blocking dielectric layer 52. Each remaining portion of the continuous charge storage material layer 54L in a second support opening 319 constitutes a middle dielectric layer 54' having a same composition and a same thickness as a charge storage layer 54. Each remaining portion of the continuous tunneling dielectric material layer 56L in a second support opening 319 constitutes an inner dielectric layer 56' having as same composition and a same thickness as a tunneling dielectric layer 56. Remaining portions of the continuous layer stack (52L, 54L, 56L) in the second support openings 319 constitute second dielectric layer stacks 50". Each second dielectric layer stack 50" is a combination of an outer dielectric layer 52', a middle dielectric layer 54', and an inner dielectric layer 56' located within a respective second support opening 319.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52 within each memory opening 49 and within each first support opening 19.

Optionally, the physically exposed semiconductor surface at the bottom of each memory cavity 49' may be vertically recessed so that the recessed semiconductor surface underneath the memory cavity 49' is vertically offset from the topmost surface of a pedestal channel portion 11 (or of the semiconductor material layer 10 in case pedestal channel portions 11 are not used) by a recess distance. Each memory film 50 includes a plurality of charge storage regions (comprising portions of the charge storage layer 54 located at the levels of the sacrificial material layers 42) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 in a memory opening 49 or in a first support opening 19 may have vertically coincident sidewalls.

Figure 8F:
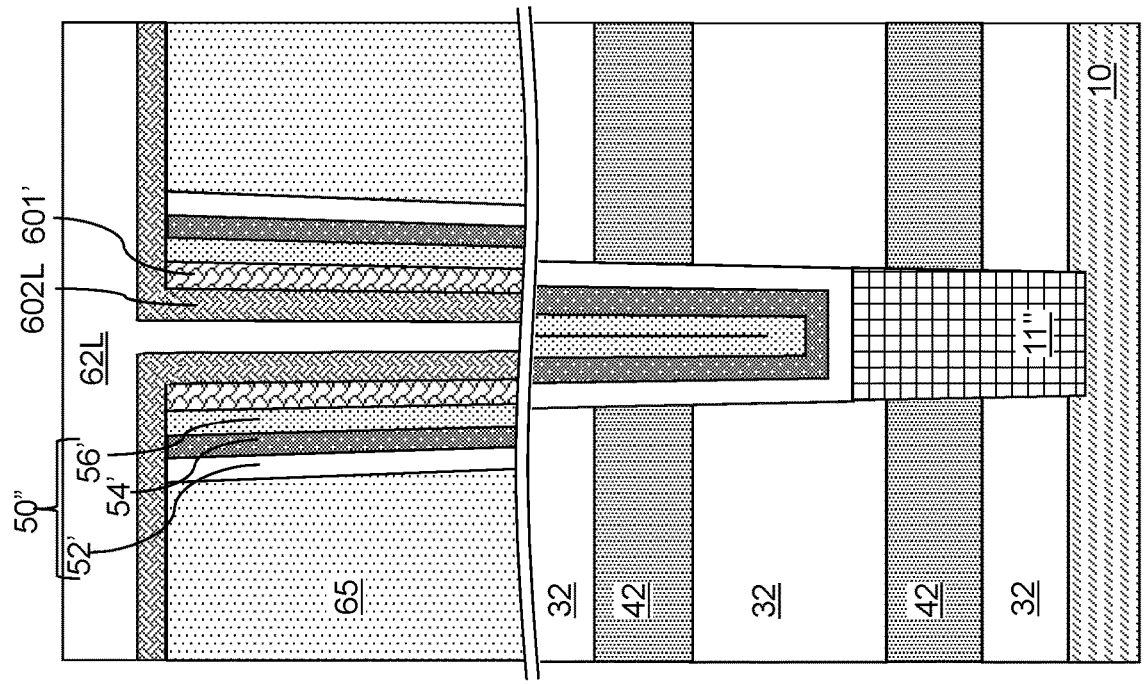
Figure 8E:
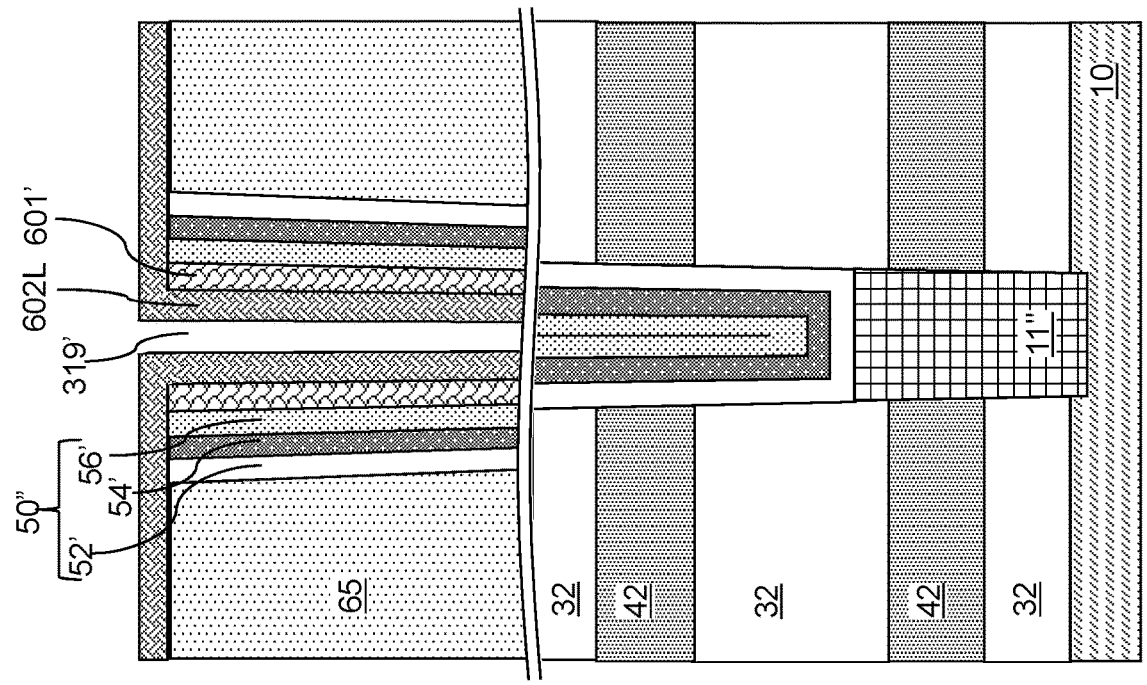

Referring to FIGS. 6E, 7E, and 8E, a second continuous semiconductor channel material layer 602L may be deposited directly on the semiconductor surface of the pedestal channel portions 11 (or the semiconductor material layer 10 if the pedestal channel portion 11 is omitted) in each of the memory openings 49, and directly on the first semiconductor channel layer 601. The second continuous semiconductor channel material layer 602L may be deposited directly on the first pedestal semiconductor portion 11', but is not deposited on the second pedestal semiconductor portions 11". The second continuous semiconductor channel material layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second continuous semiconductor channel material layer 602L includes amorphous silicon or polysilicon. The second continuous semiconductor channel material layer 602L may be formed by a conformal deposition method such as low pressure chemical vapor deposition (LPCVD). The thickness of the second continuous semiconductor channel material layer 602L may be in a range from 2 nm to 10 nm, although lesser and greater thicknesses may also be used. The second continuous semiconductor channel material layer 602L may partially fill the memory cavity 49' in each memory opening, or may fully fill the cavity in each memory opening.

The materials of the first semiconductor channel layer 601 and the second continuous semiconductor channel material layer 602L are collectively referred to as a semiconductor channel material. In other words, the semiconductor channel material is a set of all semiconductor material in the first semiconductor channel layer 601 and the second continuous semiconductor channel material layer 602L.

Referring to FIGS. 6F, 7F, and 8F, a dielectric core layer 62L may be deposited in the memory cavity 49' to fill any remaining portion of the memory cavities 49', first support cavities 19', and second support cavities 319' (if present). The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 8H:
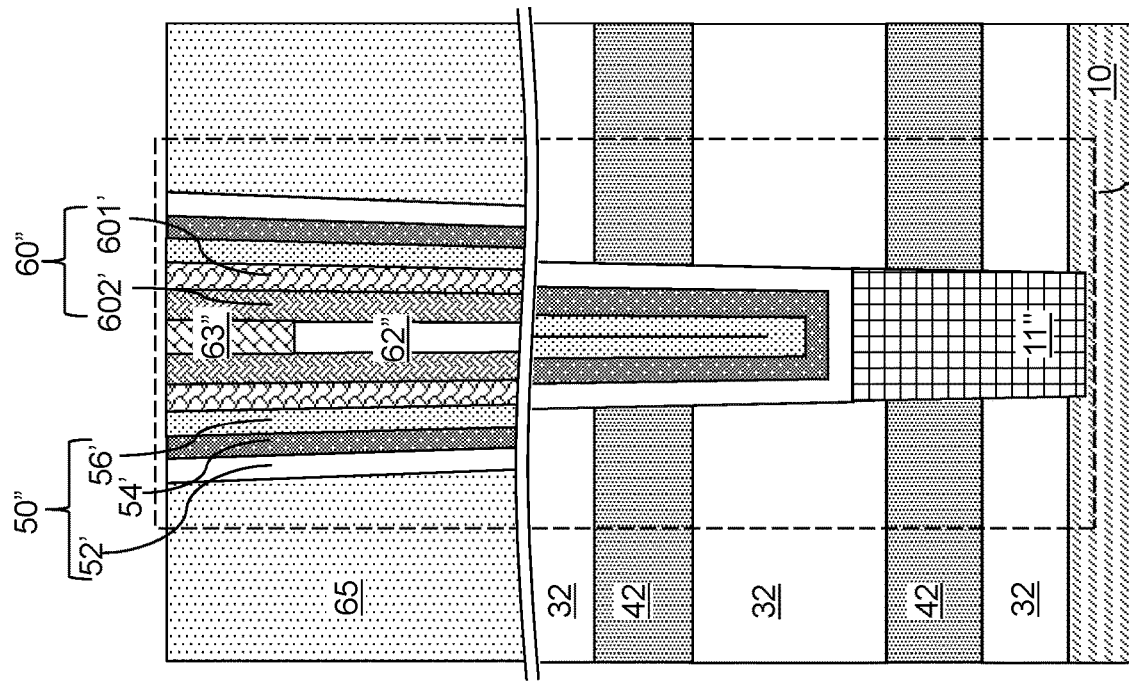
Figure 8G:
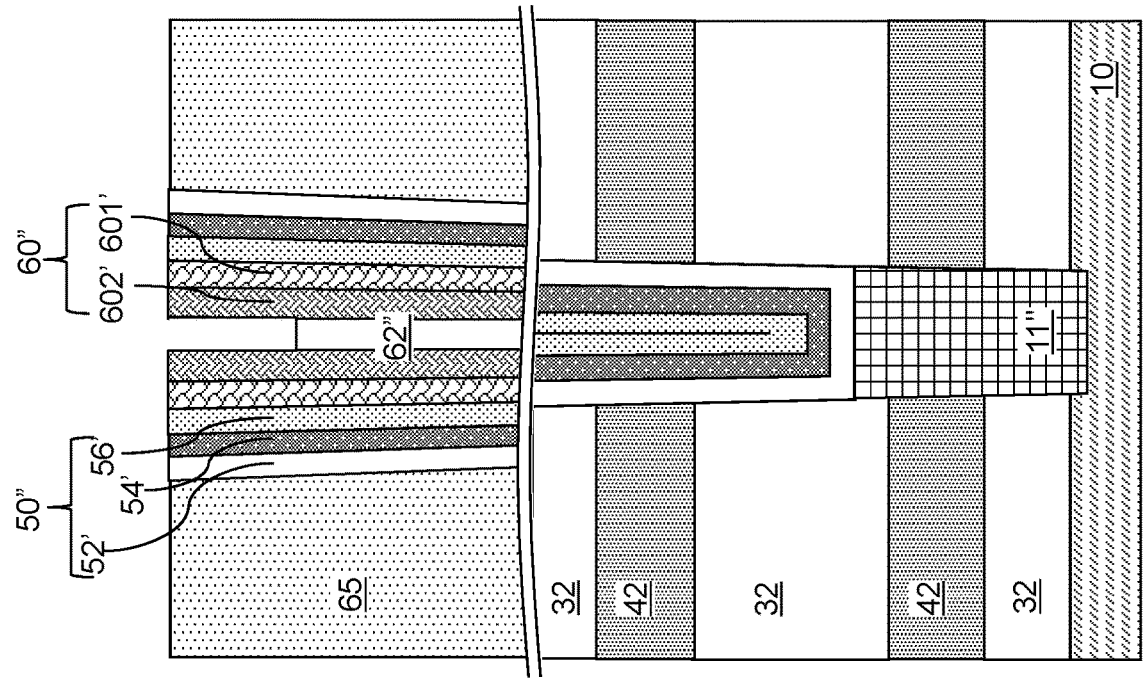

Referring to FIGS. 6G, 7G, and 8G, the horizontal portion of the dielectric core layer 62L may be removed, for example, by a recess etch from above the top surface of the insulating cap layer 70. The material of the dielectric core layer 62L may be further recessed such that remaining portions of the dielectric core layer 62L have top surfaces between a horizontal plane including a top surface of the insulating cap layer 70 and a horizontal plane including a bottom surface of the insulating cap layer 70. Each remaining portion of the dielectric core layer 62L in a memory opening 49 constitutes a memory-opening dielectric core 62. Each remaining portion of the dielectric core layer 62L in a first support opening 19 constitutes a first support-opening dielectric core 62'. Each remaining portion of the dielectric core layer 62L in a second support opening 319 constitutes a first support-opening dielectric core 62".

A memory-opening dielectric core 62 is formed in each of the memory openings 49. A first support-opening dielectric core 62' is formed in each of the first support openings 19. A second support-opening dielectric core 62" is formed in each of the second support openings 319. The second support-opening dielectric cores 62" are vertically spaced from the substrate (9, 10) by a greater distance than the first support-opening dielectric cores 62' and the memory-opening dielectric cores 62 are from the substrate (9, 10).

Further, the horizontal portion of the second continuous semiconductor channel material layer 602L located above the top surface of the insulating cap layer 70 may be removed by a planarization process, which may use a recess etch or chemical mechanical planarization (CMP). Each remaining portion of the second continuous semiconductor channel material layer 602L in the memory openings 49 constitutes a second semiconductor channel layer 602. Each remaining portion of the second continuous semiconductor channel material layer 602L in the first support openings 19 constitutes an inner semiconductor material portion 602'. Each remaining portion of the second continuous semiconductor channel material layer 602L in the second support openings 319, if present, constitutes an inner semiconductor material portion 602'. Each combination of a first semiconductor channel layer 601 and a second semiconductor channel layer 602 within a memory opening 49 constitutes a vertical semiconductor channel 60. Each vertical semiconductor channel 60 is a remaining portion of the optional first continuous semiconductor channel material layer 601L and the second continuous semiconductor channel material layer 602L that remains in a respective memory opening 49. Each vertical semiconductor channel 60 may contact an underlying pedestal channel portion 11.

Each combination of an outer semiconductor material portion 601' and an inner semiconductor material portion 602' within a first support opening 19 constitutes a first semiconductor channel material portion 60'. Each first semiconductor channel material portion 60' is a remaining portion of the optional first continuous semiconductor channel material layer 601L and the second continuous semiconductor channel material layer 602L that remains in a respective first support opening 19. Each first semiconductor channel material portion 60' may contact an underlying first pedestal semiconductor portion 11'.

Each combination of an outer semiconductor material portion 601' and an inner semiconductor material portion 602' within a second support opening 319 constitutes a second semiconductor channel material portion 60". Each second semiconductor channel material portion 60" is a remaining portion of the optional first continuous semiconductor channel material layer 601L and the second continuous semiconductor channel material layer 602L that remains in a respective second support opening 319. Each second semiconductor channel material portion 60" may be vertically spaced from an underlying second pedestal semiconductor portion 11". Thus, the second semiconductor channel material portions 60" may be vertically spaced from the substrate (9, 10) by a greater vertical distance than the first semiconductor channel material portions 60' and the vertical semiconductor channels 60 are from the substrate (9, 10).

Each vertical semiconductor channel 60 is a portion of a semiconductor channel of a multi-gated vertical field effect transistor. Each memory film 50 may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52.

Referring to FIGS. 6H, 7H, and 8H, a doped semiconductor material having a doping of a second conductivity type may be deposited within each recessed region above the memory-opening dielectric cores 62, the first support-opening dielectric cores 62', and the second support-opening dielectric cores 62". Excess portions of the deposited doped semiconductor material may be removed from above the horizontal plane including a top surface of the insulating cap layer 70 by a planarization process, which may include a recess etch process and/or a chemical mechanical planarization process. A drain region 63 may be formed within each recess region overlying a memory-opening dielectric core 62, a first dummy drain region 63' may be formed within each recess region overlying a first support-opening dielectric core 62', and a second dummy drain region 63" may be formed within each drain region overlying a second support-opening dielectric core 62".

The drain regions 63, the first dummy drain regions 63', and the second dummy drain regions 63" may have a doping of a second conductivity type that is the opposite of the first conductivity type. For example, if the first conductivity type is p-type, the second conductivity type is n-type, and vice versa. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

A set of material portions that fills a memory opening 49 is herein referred to as a memory opening fill structure 58. A set of material portions that fills a first support opening 19 is herein referred to as a first support pillar structure 20. A set of material portions that fills a second support opening 319 is herein referred to as a second support pillar structure 320. Each memory opening fill structure comprises a combination of a pedestal channel portion 11 (if present), a memory stack structure 55, a memory-opening dielectric core 62, and a drain region 63 within a memory opening 49 is herein referred to as a memory opening fill structure 58.

The memory opening fill structures 58 are formed in a memory array region 100 of the alternating stack (32, 42), and support pillar structures (20, 320) are formed in the staircase region 300 of the alternating stack (32, 42). The support pillar structures (20, 320) comprise first support pillar structures 20 and having a first maximum lateral dimension and second support pillar structures 320 having a second maximum lateral dimension that is less than the first maximum lateral dimension and interlaced with the first support pillar structures 20. In one embodiment, the first support pillar structures 20 and the second support pillar structures 320 may be arranged as a two-dimensional periodic array of a unit cell UC that includes at least two instances of the first support pillar structures 20 and at least one instance of the second support pillar structures 320. In one embodiment, each of the first support openings 19 and the second support openings 319 may be formed with a respective circular horizontal cross-sectional shape, and each of the first support pillar structures 20 and the second support pillar structures 320 may have a radial symmetry around a respective vertical axis that passes through a geometrical center of a respective one of the first support pillar structures 20 and the second support pillar structures 320. As used herein, a geometrical center of an element refers to the center of gravity of a hypothetical element occupying the same volume as the element and having a uniform density throughout.

Figure 9:
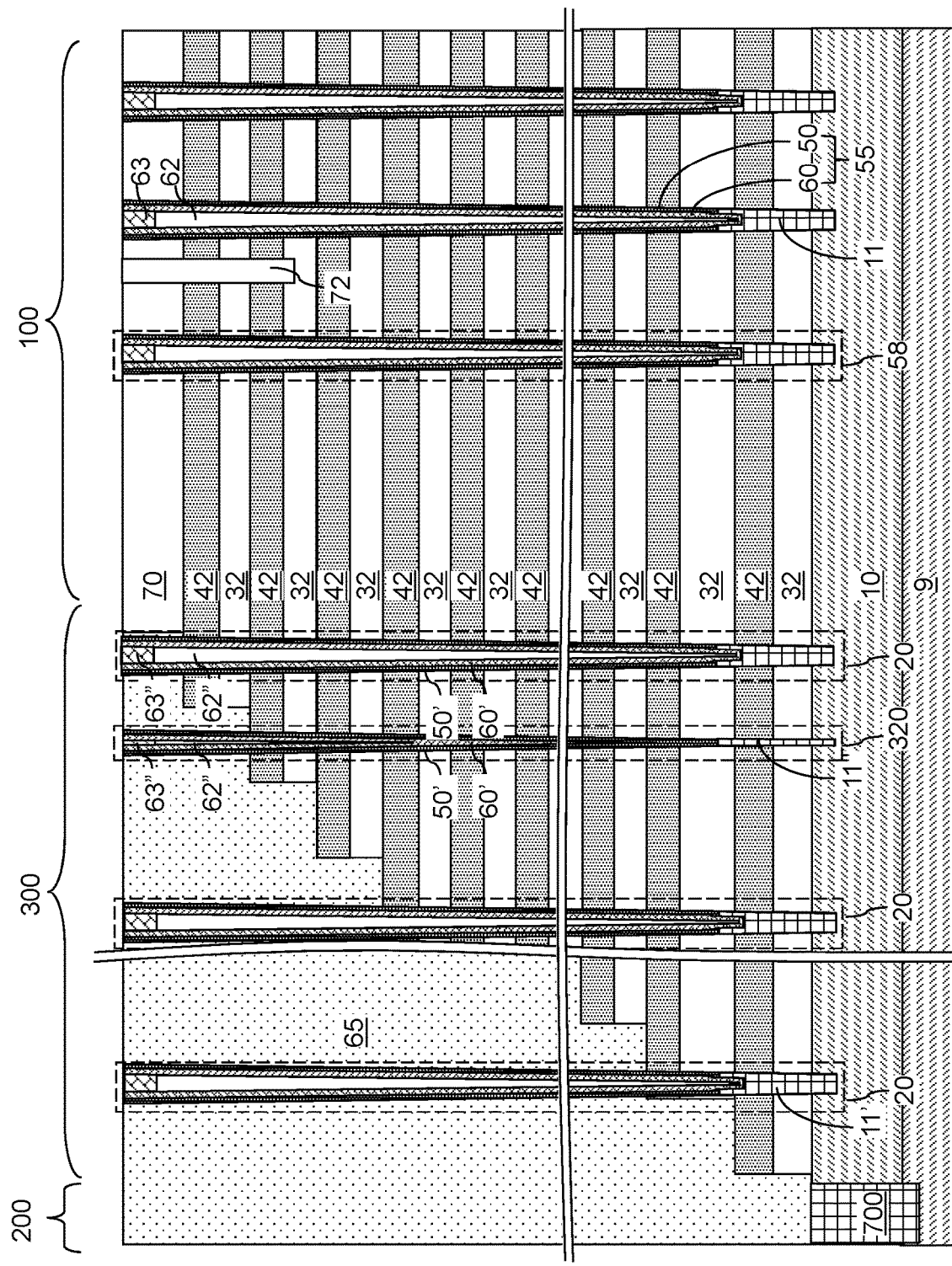
FIG. 9 is a schematic vertical cross-sectional view of the exemplary structure after formation of memory opening fill structures, first support pillar structures, and second support pillar structures according to an embodiment of the present disclosure.

Referring to FIG. 9, the exemplary structure is illustrated after formation of memory opening fill structures 58 and support pillar structures (20, 320) within the memory openings 49 and the support openings (19, 319), respectively. An instance of a memory opening fill structure 58 may be formed within each memory opening 49 of the structure of FIGS. 4A and 4B. An instance of a first support pillar structure 20 may be formed within each first support opening 19 of the structure of FIGS. 4A and 4B. An instance of a second support pillar structure 320 may be formed within each second support opening 319 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 10A:
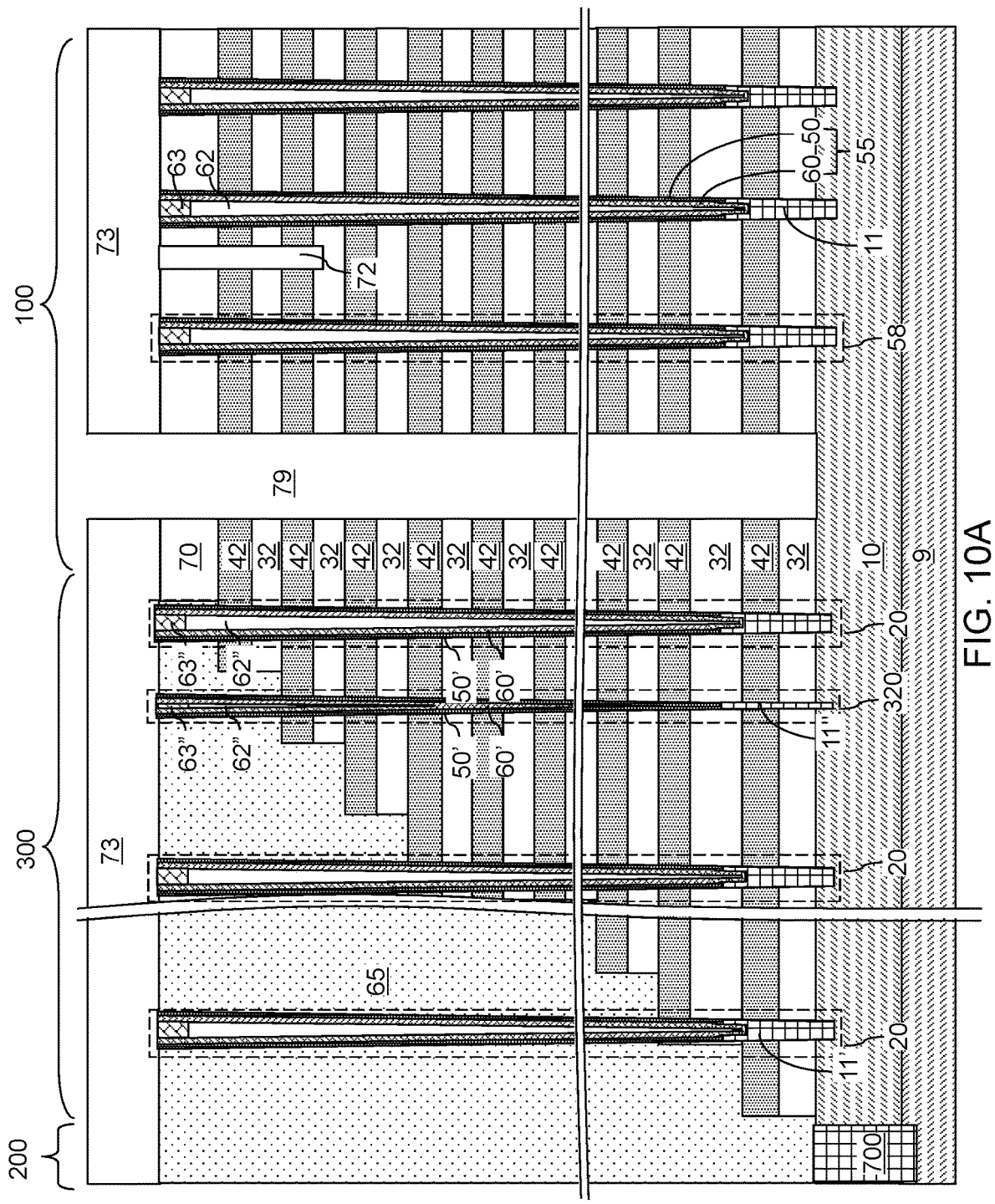
FIG. 10A is a schematic vertical cross-sectional view of the exemplary structure after formation of backside trenches according to an embodiment of the present disclosure.
Figure 10B:
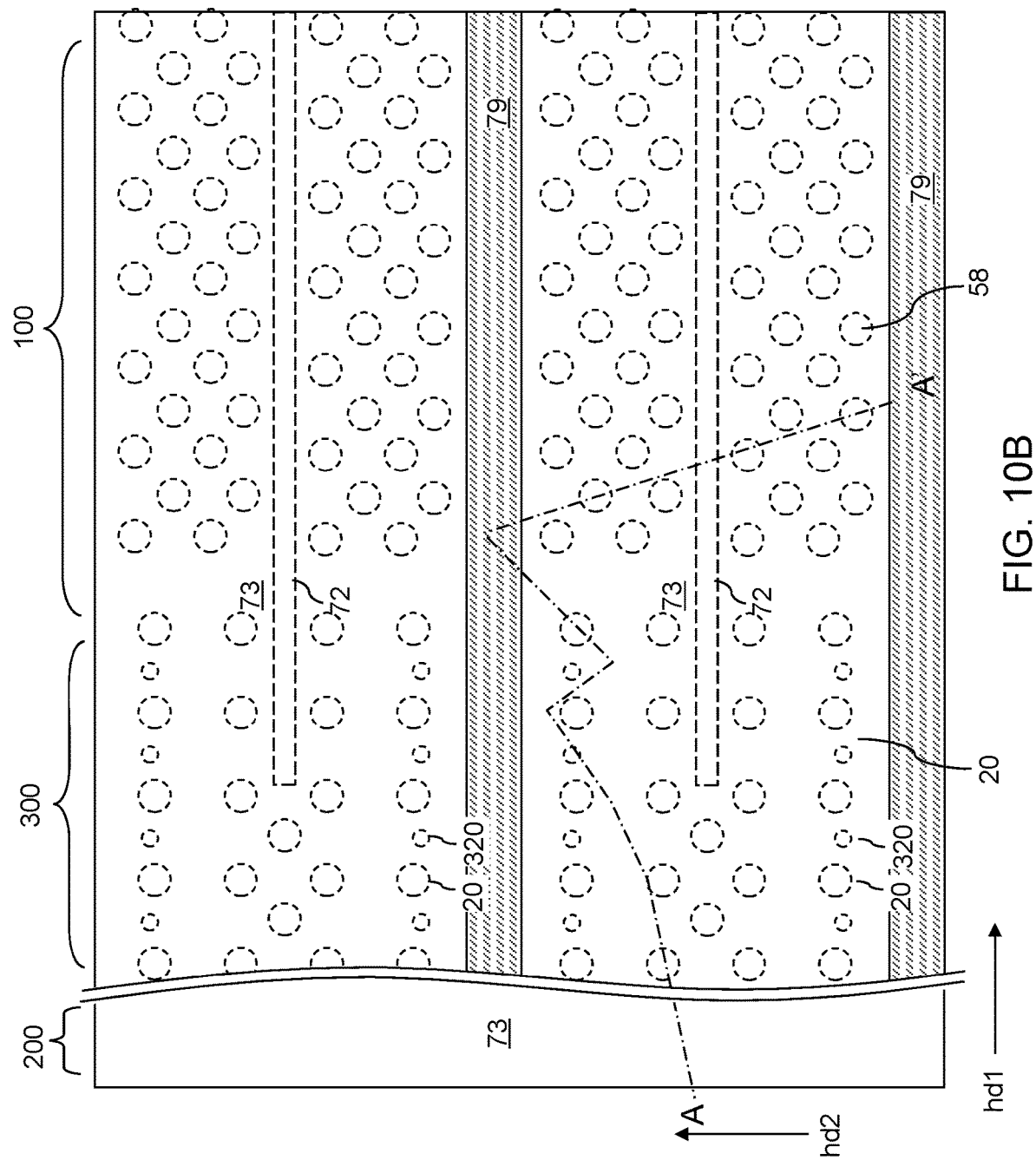
FIG. 10B is a partial see-through top-down view of the exemplary structure of FIG. 10A. The vertical plane A-A' is the plane of the schematic vertical cross-sectional view of FIG. 10A.

Referring to FIGS. 10A and 10B, a contact level dielectric layer 73 may be formed over the alternating stack (32, 42) of insulating layer 32 and sacrificial material layers 42, and over the memory stack structures 55 and the support pillar structures (20, 320). The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain select level isolation structures 72 may laterally extend along the first horizontal direction hd1. Each backside trench 79 may have a uniform width that is invariant along the lengthwise direction (i.e., along the first horizontal direction hd1). Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 11:
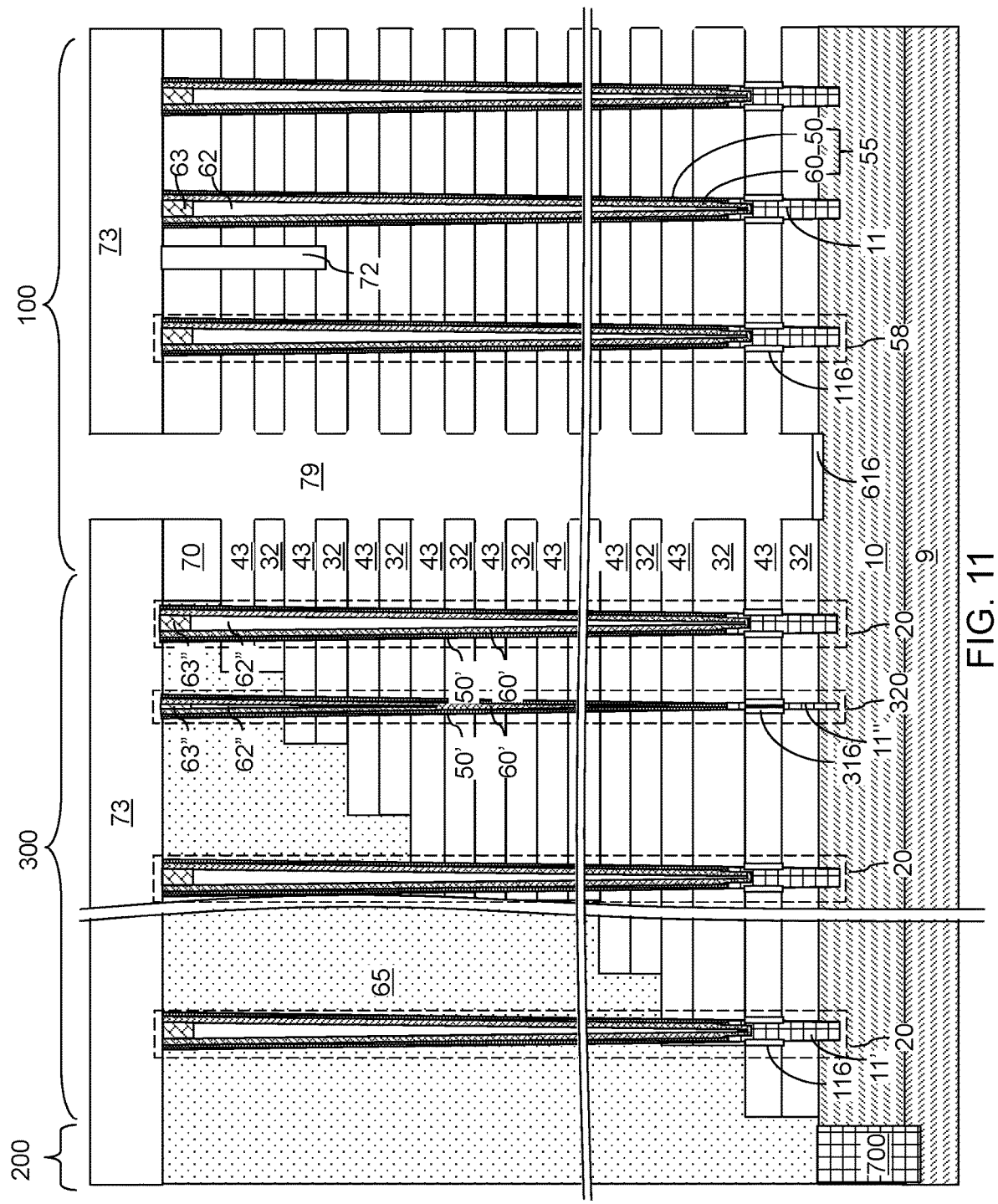
FIG. 11 is a schematic vertical cross-sectional view of the exemplary structure after formation of backside recesses according to an embodiment of the present disclosure.

Referring to FIGS. 11 and 12A, an etchant that selectively etches the second material of the sacrificial material layers 42 with respect to the first material of the insulating layers 32 may be introduced into the backside trenches 79, for example, using an etch process. FIG. 12A illustrates a region of the exemplary structure of FIG. 11. Backside recesses 43 are formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials used in the art. The memory opening fill structures 58, the support pillar structures (20, 320), the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the pedestal channel portions 11, the first pedestal semiconductor portion 11', the second pedestal semiconductor portion 11", and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 and each first pedestal semiconductor portion 11' into a respective tubular dielectric spacer 116, a surface portion of each second pedestal semiconductor portion 11" into a respective semiconductor oxide spacer 316, and to convert each physically exposed surface portion of the semiconductor material layer 10 into a planar dielectric portion 616.

In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. The semiconductor oxide spacers 316 may have a tubular configuration and may be topologically homeomorphic to a torus if the oxidation process does not reach a center axis of a respective second support pillar structure 320. Alternatively, the semiconductor oxide spacers 316 may be topologically homeomorphic to a sphere if the oxidation process reaches the center axis of the respective second support pillar structure 320. Each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 12B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 12C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 13:
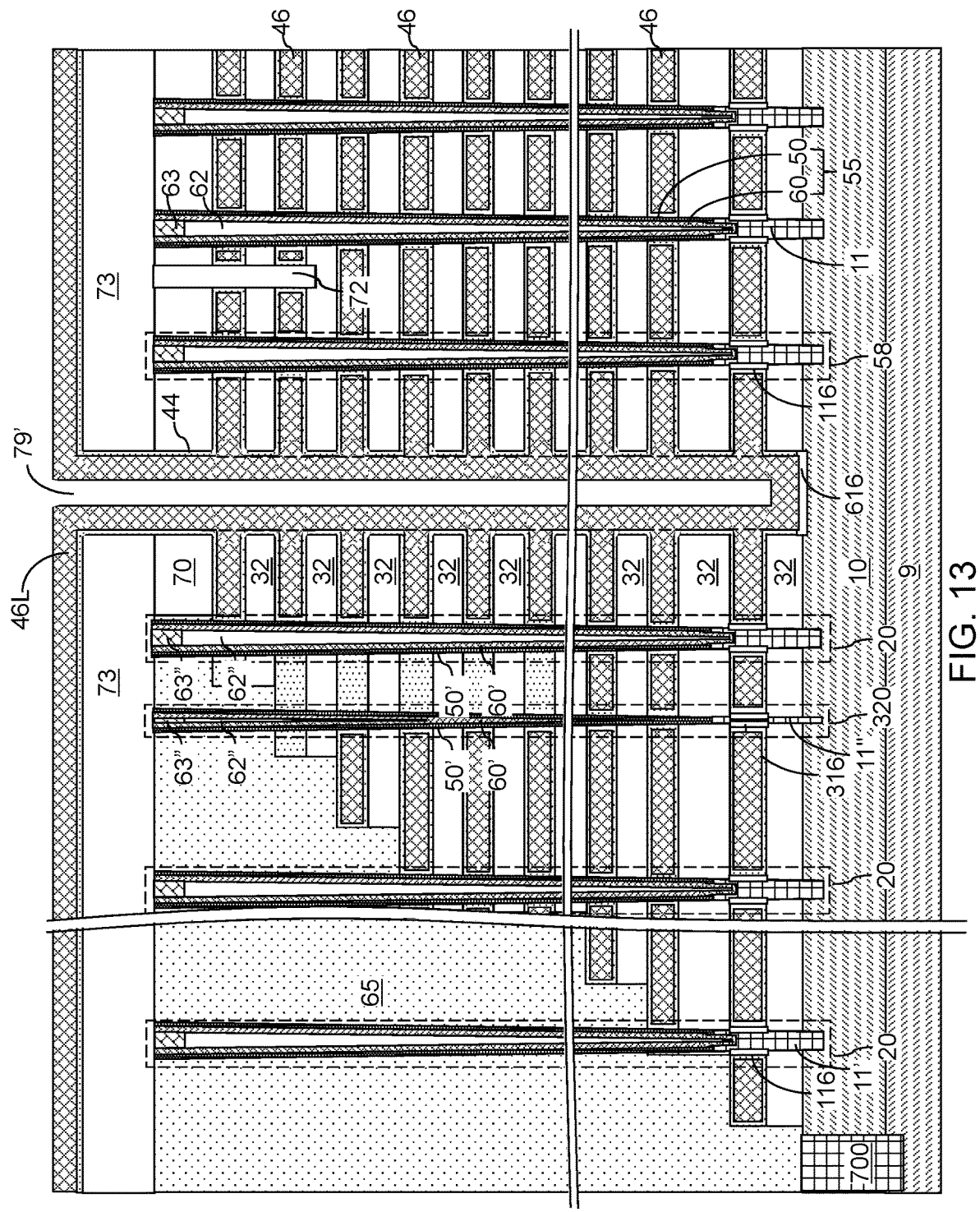
FIG. 13 is a schematic vertical cross-sectional view of the exemplary structure at the processing step of FIG. 12D.

Referring to FIGS. 12D and 13, a metal fill material is deposited in the plurality of backside recesses 43, on the sidewalls of the at least one the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited using a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous electrically conductive material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 14A:
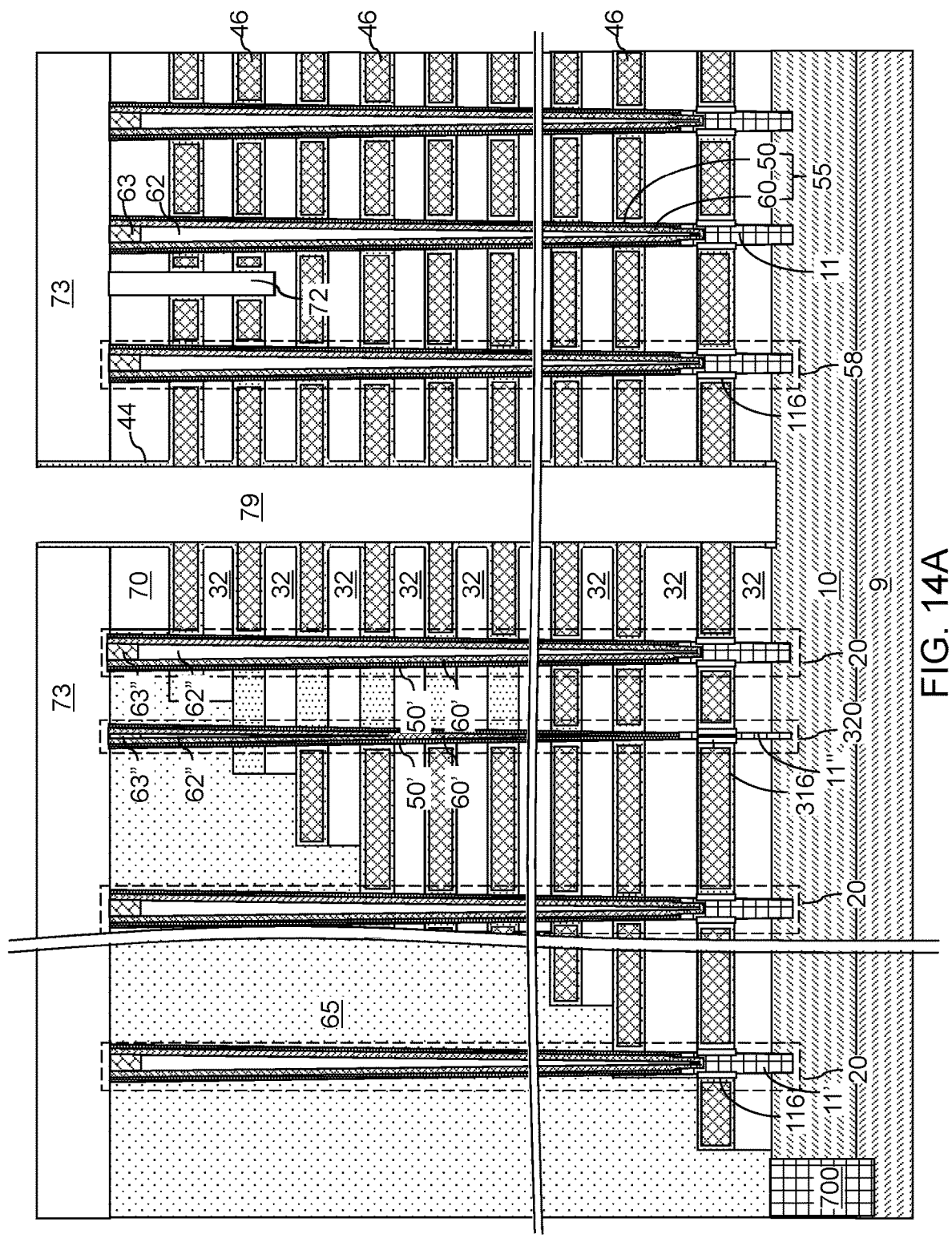
FIG. 14A is a schematic vertical cross-sectional view of the exemplary structure after removal of a deposited conductive material from within the backside trench according to an embodiment of the present disclosure.
Figure 14B:
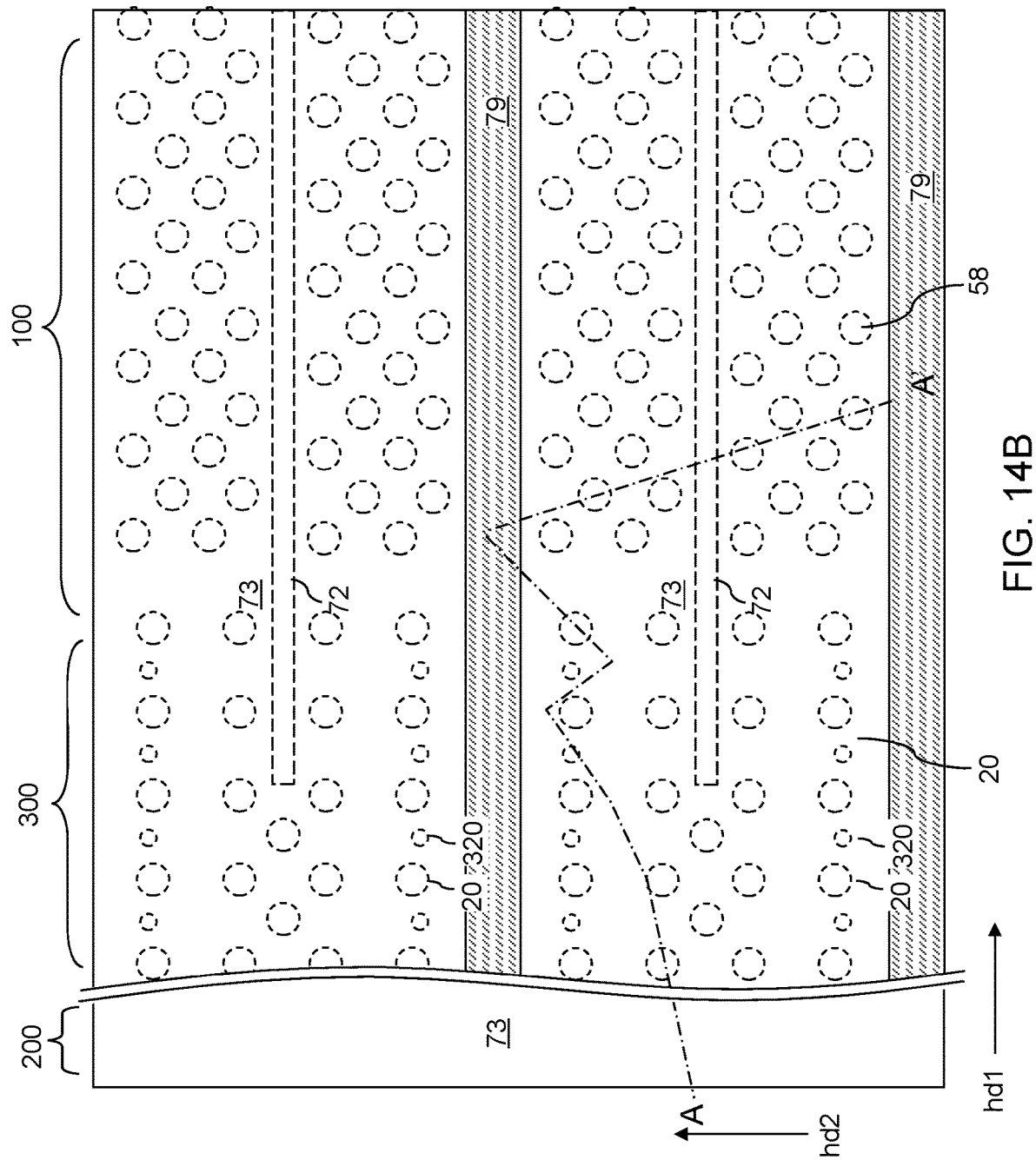
FIG. 14B is a partial see-through top-down view of the exemplary structure of FIG. 14A. The vertical plane A-A' is the plane of the schematic vertical cross-sectional view of FIG. 14A.
Figure 15A:
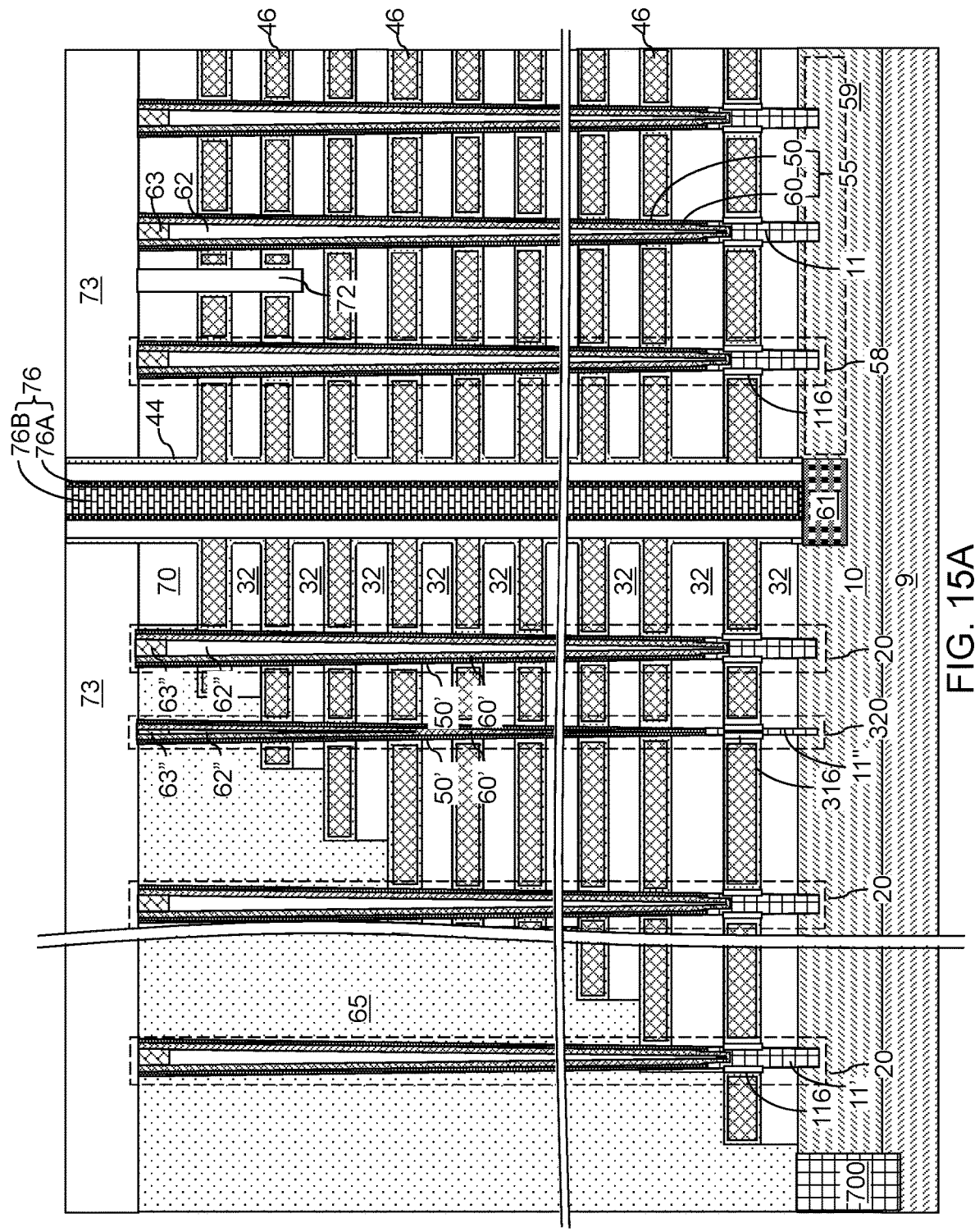
FIG. 15A is a schematic vertical cross-sectional view of the exemplary structure after formation of an insulating spacer and a backside contact structure according to an embodiment of the present disclosure.

Referring to FIGS. 14A and 14B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 may be removed during removal of the continuous electrically conductive material layer 46L. A backside cavity 79' is present within each backside trench 79.

Referring to FIGS. 14A and 14B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 16A:
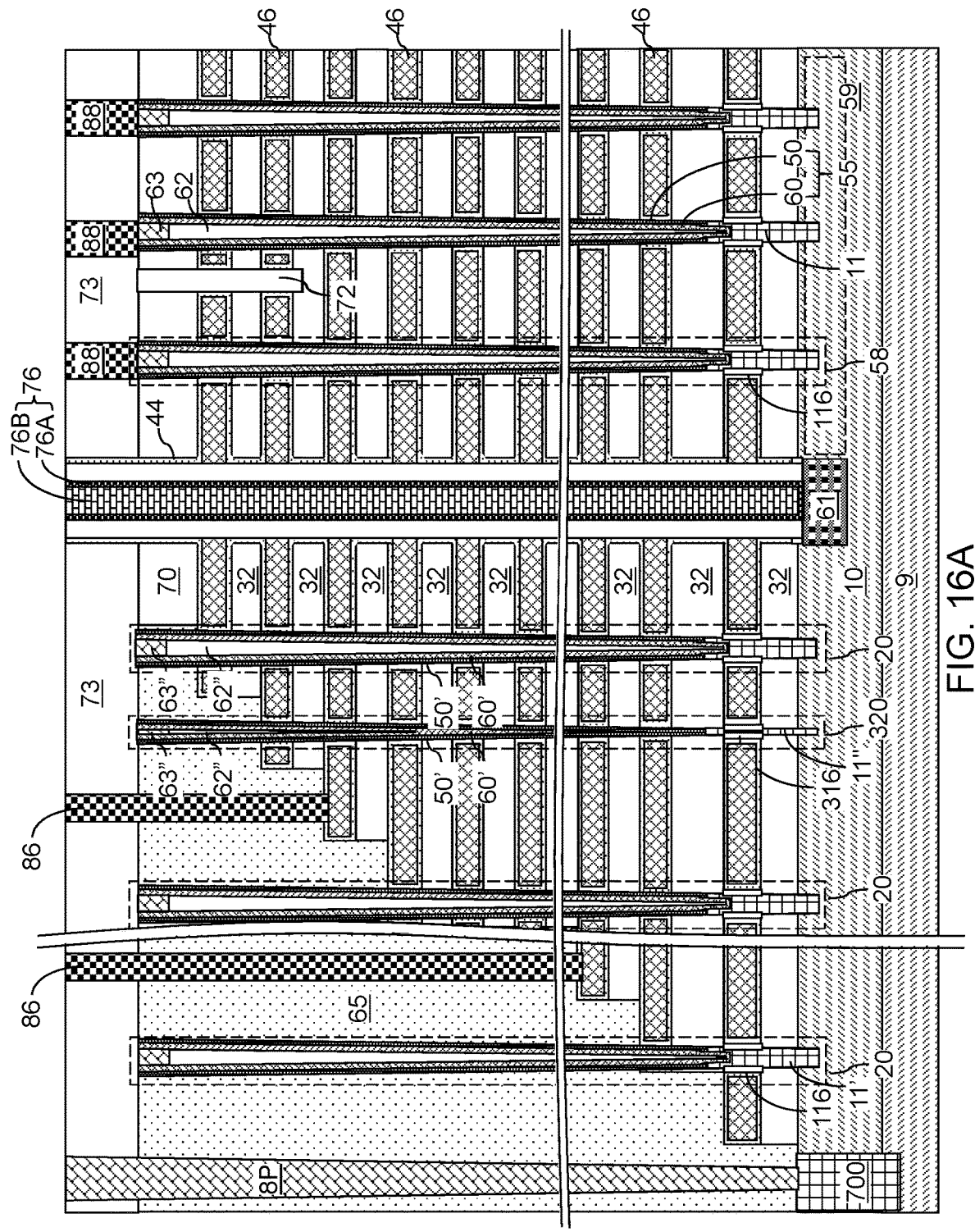
FIG. 16A is a schematic vertical cross-sectional view of the exemplary structure after formation of additional contact via structures according to an embodiment of the present disclosure.
Figure 16B:
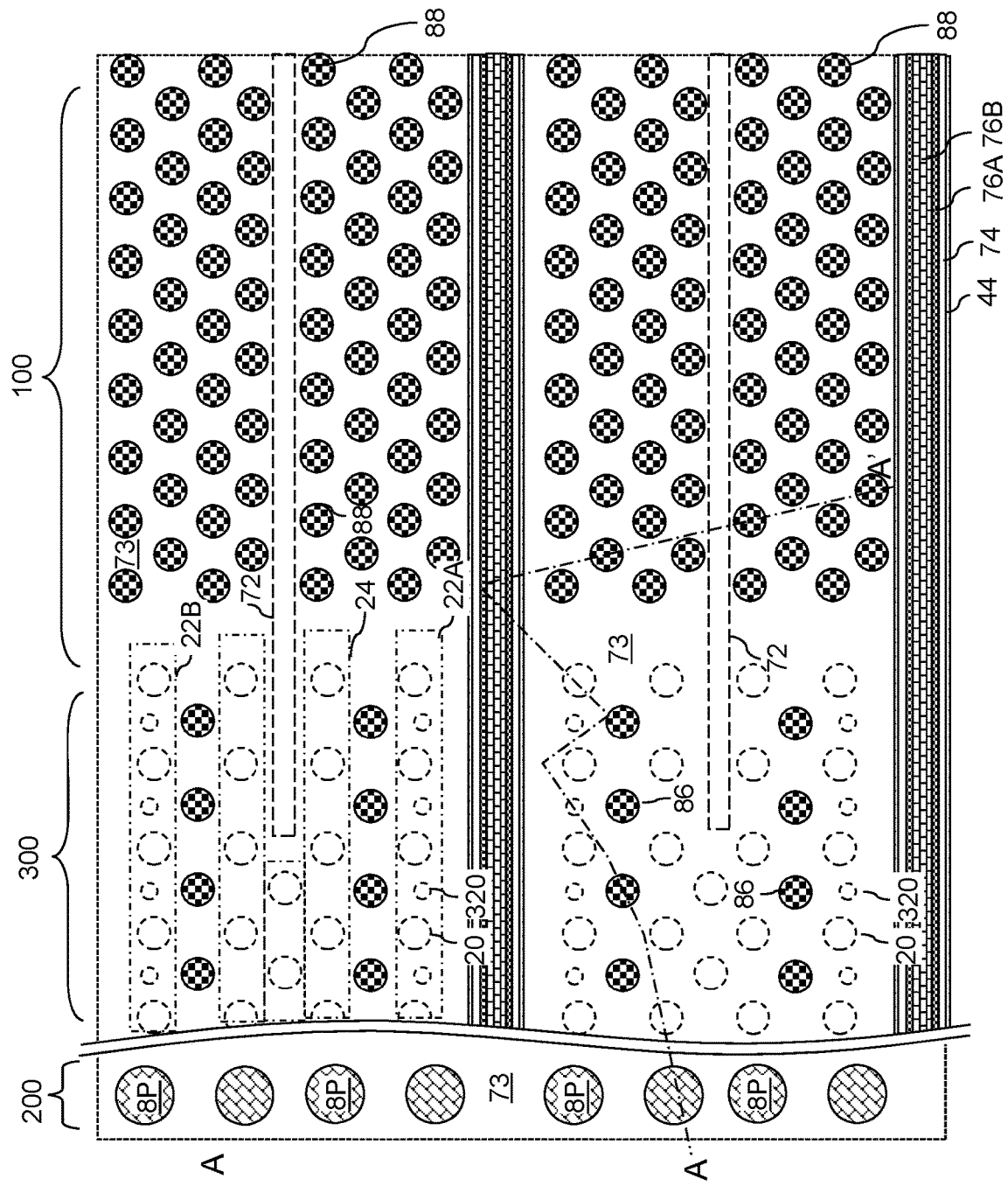
FIG. 16B is a top-down view of the exemplary structure of FIG. 16A. The vertical plane A-A' is the plane of the schematic vertical cross-sectional view of FIG. 16A.

Referring to FIGS. 16A and 16B, additional contact via structures (88, 86, 8P) may be formed through the contact level dielectric layer 73, and optionally through the retro-stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the retro-stepped dielectric material portion 65. Peripheral device contact via structures 8P may be formed through the retro-stepped dielectric material portion 65 directly on respective nodes of the peripheral devices.

Figure 17C:
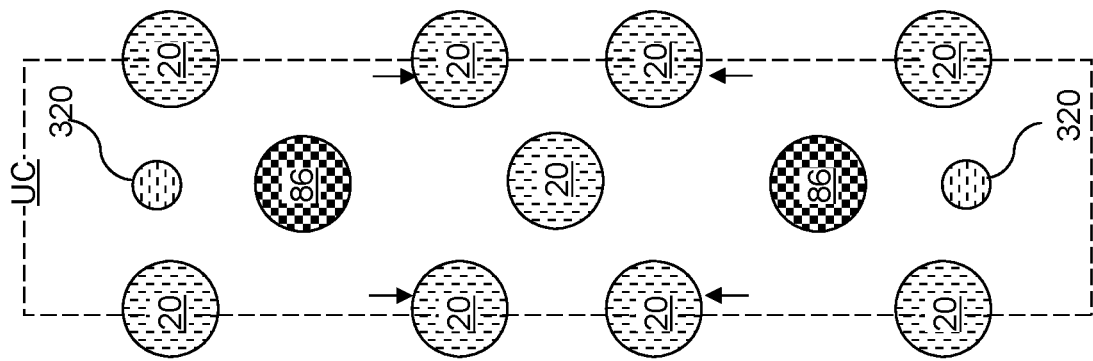
FIGS. 17A-17E are various layouts for a unit cell including at least two first support pillar structures and at least one second support pillar structure with respect to at least one interlaced word line contact via structure 86 according an embodiment of the present disclosure.
Figure 17B:
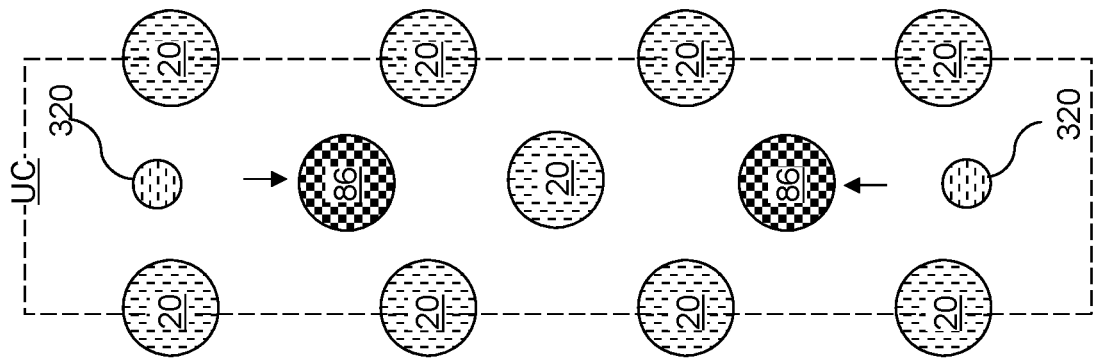
Figure 17A:
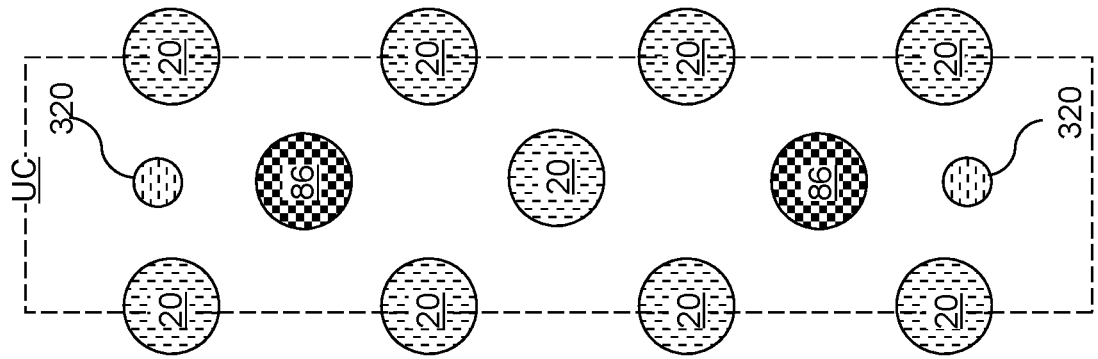
Figure 17E:
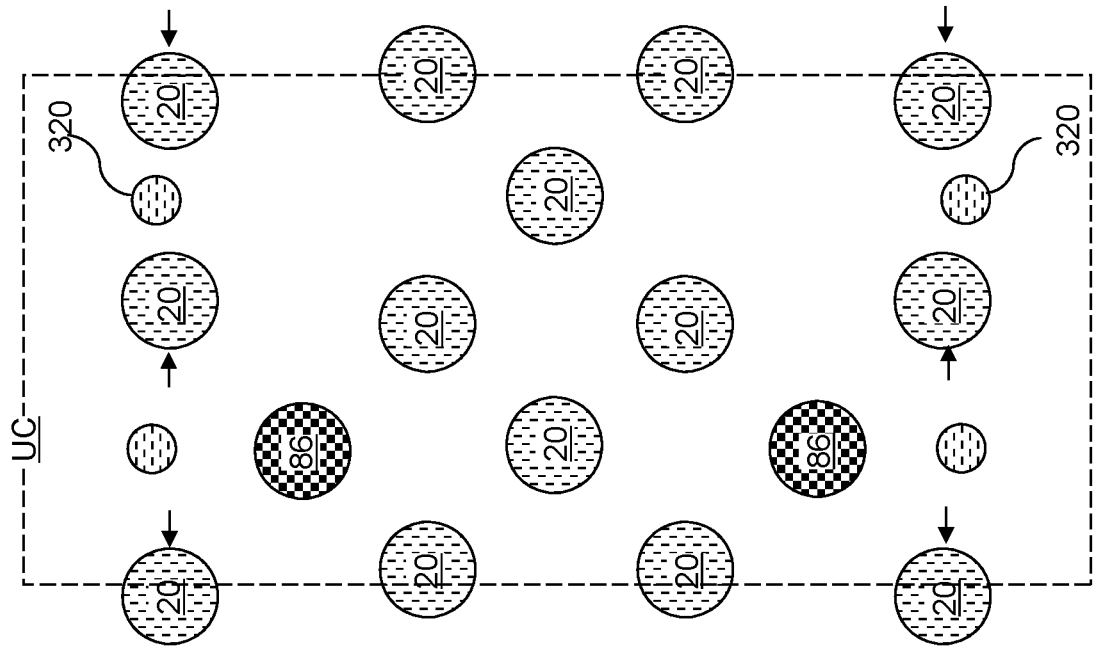
Figure 17D:
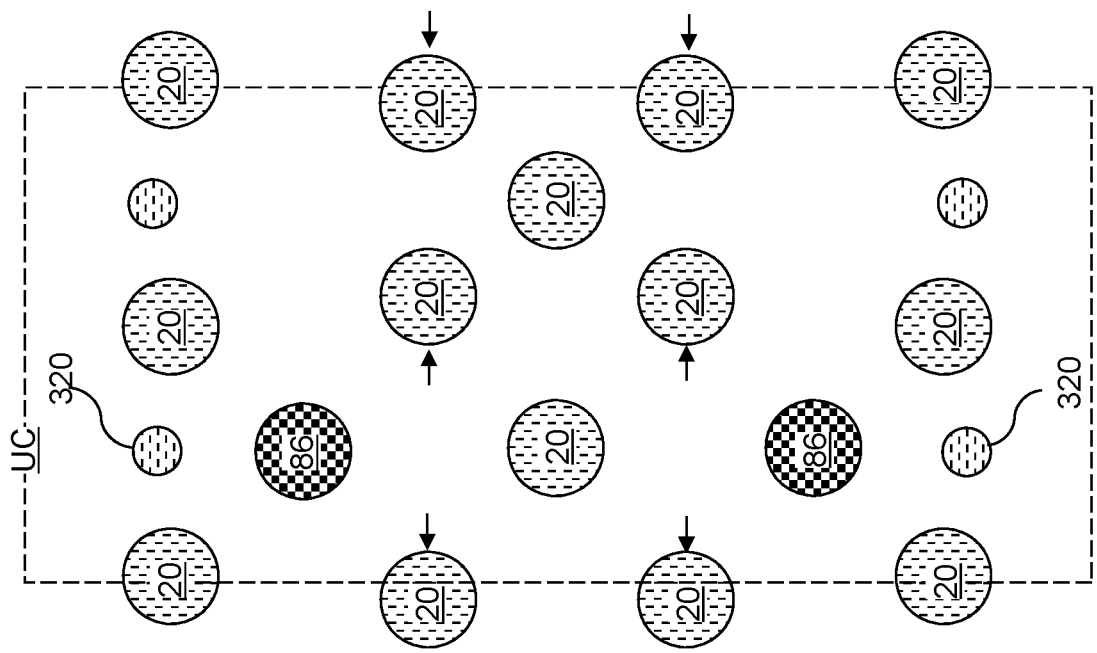

FIGS. 17A-17E illustrates various layouts for a unit cell UC in plan views. Each unit cell UC includes at least two first support pillar structures 20 and at least one second support pillar structure 320 with respect to at least one interlaced word line contact via structure 86. The layouts for the unit cell UC and the word line contact via structures 86 illustrated in FIGS. 17A and 17B may use the layout of the unit cell UC illustrated in FIG. 5A. The word line contact via structures 86 may be located at geometrical centers between a respective set of four first support pillar structures 20 as illustrated in FIG. 17A, or may be shifted away from (or toward) an adjacent backside trench as illustrated in FIG. 17B. The layout for the unit cell UC and the word line contact via structures 86 illustrated in FIG. 17C may use the layout of the unit cell UC illustrated in FIG. 5B. The layout for the unit cell UC and the word line contact via structures 86 illustrated in FIG. 17D may use the layout of the unit cell UC illustrated in FIG. 5C. The layout for the unit cell UC and the word line contact via structures 86 illustrated in FIG. 17E may use the layout of the unit cell UC illustrated in FIG. 5D.

Referring to all drawings and according to various embodiments of the present disclosure, a three-dimensional memory device includes an alternating stack of insulating layers 32 and electrically conductive layers 46 located over a substrate (9, 10) and comprising a staircase region 300 having stepped surfaces; memory stack structures 55 extending through the alternating stack (32, 46), wherein each of the memory stack structures 55 comprises a memory film 50 and a vertical semiconductor channel 60 contacting an inner sidewall of the memory film 50; first support pillar structures 20 vertically extending through the staircase region 300 of the alternating stack (32, 46) and having a first maximum lateral dimension; and second support pillar structures 320 vertically extending through the staircase region 300 of the alternating stack (32, 46), having a second maximum lateral dimension that is less than the first maximum lateral dimension, and interlaced with the first support pillar structures 20. As used herein, first elements are "interlaced" with second elements if instances of the first elements and instances of the second elements alternate along a direction.

In one embodiment, the first support pillar structures 20 and the second support pillar structures 320 are arranged as a two-dimensional periodic array of a unit cell UC that includes at least two instances of the first support pillar structures 20 and at least one instance of the second support pillar structures 320.

In one embodiment, at least upper portions of each of the first support pillar structures 20 and the second support pillar structures 320 has a radial symmetry around a vertical axis that passes through a geometrical center of a respective one of the first support pillar structures 20 and the second support pillar structures 320. In this case, the first support openings 19 and the second support openings 319 may have circular horizontal cross-sectional shapes with different diameters (i.e., respective diameters which are perpendicular to the vertical axis and parallel to the major (i.e., top) surface of the substrate have a different horizontal length from each other). In this embodiment, at least upper portions of the first support pillar structures 20 have circular horizontal cross-sectional shapes with a first diameter size and at least upper portions of the second support pillar structures 320 have circular horizontal cross-sectional shapes with a second diameter size different from the first diameter size. All first support pillar structures 20 may have a first average diameter size and all the second support pillar structures 320 may have a second average diameter size different from the first average diameter size.

In one embodiment, each of the memory films 50 of the memory stack structures 55 comprises a blocking dielectric layer 52, a charge storage layer 54, and a tunneling dielectric layer 56, each of the first support pillar structures 20 comprises a respective first dielectric layer stack 50'; each of the second support pillar structures 320 comprises a respective second dielectric layer stack 50"; and each of the first dielectric layer stacks 50' and the second dielectric layer stacks 50" includes an outer dielectric layer 52' having a same composition and a same thickness as the blocking dielectric layer 52, a middle dielectric layer 54' having a same composition and a same thickness as the charge storage layer 54, and an inner dielectric layer 56' having as same composition and a same thickness as the tunneling dielectric layer 56.

In one embodiment, each of the first support pillar structures 20 comprises a first support-opening dielectric core 62' laterally surrounded by a respective first dielectric layer stack 50'; each of the second support pillar structures 320 comprises a second support-opening dielectric core 62" laterally surrounded by a respective second dielectric layer stack 50"; and the second support-opening dielectric cores 62" are vertically spaced from the substrate (9, 10) by a greater distance than the first support-opening dielectric cores 62' are from the substrate (9, 10).

In one embodiment, each of the first support pillar structures 20 comprises a first semiconductor channel material portion 60' including a same material as the vertical semiconductor channels 60 and laterally surrounded by a respective first dielectric layer stack 50'; and each of the second support pillar structures 310 comprises a second semiconductor channel material portion 60" including a same material as the vertical semiconductor channels 60 and laterally surrounded by a respective second dielectric layer stack 50".

In one embodiment, the second semiconductor channel material portions 60" are vertically spaced from the substrate (9, 10) by a greater distance than the first semiconductor channel material portions 60' are from the substrate (9, 10).

In one embodiment, each of the memory stack structures 55 contacts a top surface of a respective pedestal channel portion 11; each of the first support pillar structures 20 comprises a respective first pedestal semiconductor portion 11' that contacts a bottom surface of a respective one of the first semiconductor channel material portions 60'; and each of the second support pillar structures 320 comprises a respective second semiconductor channel material portion 11" that underlies, and is vertically spaced from, a respective one of the second semiconductor channel material portions 60".

In one embodiment, a retro-stepped dielectric material portion 65 may overlie the stepped surfaces of the alternating stack (32, 46). The first support pillar structures 20 and the second support pillar structures 320 extend through the retro-stepped dielectric material portion 65, and have top surfaces within a horizontal plane including a top surface of the retro-stepped dielectric material portion 65.

In one embodiment, a backside trench 79 may vertically extend through the alternating stack (32, 46) and the retro-stepped dielectric material portion 65, and may laterally extend along a first horizontal direction hd1. The first support pillar structures 20 and the second support pillar structures 320 are arranged in rows that extend along the first horizontal direction hd1.

In one embodiment, at least one row of first support pillar structures 20 may have a uniform intra-row pitch between neighboring pairs of first support pillar structures 20 along the first horizontal direction hd1. In one embodiment, at least one row of first support pillar structures 20 may have a periodic modulation of an inter-row pitch that is repeated along the first horizontal direction hd1. In one embodiment, each row of second support pillar structures 320 may have a uniform intra-row pitch between neighboring pairs of second support pillar structures 320 along the first horizontal direction hd1, which may be the same as the uniform intra-row pitch of a row of first support pillar structures 20.

In another embodiment, a three-dimensional memory device includes an alternating stack of insulating layers 32 and electrically conductive layers 46 located over a substrate (9, 10) and comprising a staircase region 300 having stepped surfaces; memory stack structures 55 extending through the alternating stack (32, 46), wherein each of the memory stack structures 55 comprises a memory film 50 and a vertical semiconductor channel 60 contacting an inner sidewall of the memory film 50; first and second backside trenches 79 vertically extending through the alternating stack along a first horizontal direction hd1; and first support pillar structures 20 and second support pillar structures 320 vertically extending through the staircase region of the alternating stack.

The first support pillar structures 20 are arranged in a plurality of row rows that are located between the first and second backside trenches 79. The plurality of rows comprise a first boundary row 22A and second boundary row 22A that extend along the first horizontal direction adjacent to the first and second backside trenches 79, and a least one inner row 24 (e.g., three inner rows shown in FIG. 16B) that extends along the first horizontal direction between the first and second boundary rows (22A, 22B), as shown for example in FIG. 16B. The first support pillar structures 20 have the same pitch in the first and second boundary rows (22A, 22B) and in the at least one inner row 24. The second support pillar 320 structures are located between the first support pillar structures 20 in the first and second boundary rows (22A, 22B). However, the second support pillar structures 320 are not located in the at least one inner row 24 to provide an asymmetric support pillar configuration, as shown in FIG. 16B. In this embodiment, the first and second support pillar structures may have the same or different size (e.g., diameter) from each other.

The exemplary structures may include a three-dimensional memory device. In one embodiment, the three-dimensional memory device comprises a monolithic three-dimensional NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit (comprising a subset of the least one semiconductor device 700) for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion (such as a vertical semiconductor channel 60) of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

The combination of the first support pillar structures 20 and the second support pillar structures 320 may be used to provide enhanced structural support to the insulating layers 32 in the staircase region 300 during replacement of the sacrificial material layers 42 with the electrically conductive layers 46. Specifically, the second support pillar structures 320 provide additional structural support at interstitial regions of the first support pillar structures 20. Leakage current through the second support pillar structures 320 may be eliminated or significantly reduced by vertically spacing the second semiconductor channel material portion 60" from the second pedestal semiconductor portion 11", which may be effected by reducing the lateral dimensions of the second support pillar structures 320 relative to the lateral dimensions of the first support pillar structures 20. Moreover, the combination of the first support pillar structures 20 and the second support pillar structures 320 may be used to provide a manufacturing process friendly design at a lower cost but at a higher performance. The embodiments provided herein avoid insulating layer 32 buckling during and after formation of the backside recesses 43. In one embodiment, the second support pillar structure 320 may be of a smaller dimension than that of first support pillar structure 20. However, the additional the second support pillar structure 320 of the smaller dimension provides reinforcement against buckling.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate and comprising a staircase region having stepped surfaces;
   memory stack structures extending through the alternating stack, wherein each of the memory stack structures comprises a memory film and a vertical semiconductor channel contacting an inner sidewall of the memory film;
   first support pillar structures vertically extending through the staircase region of the alternating stack and having a first maximum lateral dimension; and
   second support pillar structures vertically extending through the staircase region of the alternating stack, having a second maximum lateral dimension that is different than the first maximum lateral dimension, and interlaced with the first support pillar structures;
   wherein:
      each of the memory films of the memory stack structures comprises a blocking dielectric layer, a charge storage layer, and a tunneling dielectric layer;
      each of the first support pillar structures comprises a respective first dielectric layer stack;
      each of the second support pillar structures comprises a respective second dielectric layer stack;
      each of the first dielectric layer stacks and the second dielectric layer stacks includes an outer dielectric layer having a same composition and a same thickness as the blocking dielectric layer, a middle dielectric layer having a same composition and a same thickness as the charge storage layer, and an inner dielectric layer having as same composition and a same thickness as the tunneling dielectric layer;
      each of the first support pillar structures comprises a first semiconductor channel material portion including a same material as the vertical semiconductor channels and laterally surrounded by a respective first dielectric layer stack;
      each of the second support pillar structures comprises a second semiconductor channel material portion including a same material as the vertical semiconductor channels and laterally surrounded by a respective second dielectric layer stack;
      each of the memory stack structures contacts a top surface of a respective pedestal channel portion;
      each of the first support pillar structures comprises a respective first pedestal semiconductor portion that contacts a bottom surface of a respective one of the first semiconductor channel material portions; and
      each of the second support pillar structures comprises a respective second semiconductor channel material portion that underlies, and is vertically spaced from, a respective one of the second semiconductor channel material portions.

2. A three-dimensional memory device comprising:
an alternating stack of insulating layers and electrically conductive layers located over a substrate and comprising a staircase region having stepped surfaces;
memory stack structures extending through the alternating stack, wherein each of the memory stack structures comprises a memory film and a vertical semiconductor channel contacting an inner sidewall of the memory film;
first and second backside trenches vertically extending through the alternating stack along a first horizontal direction; and
first and second support pillar structures vertically extending through the staircase region of the alternating stack;
wherein:
the first support pillar structures are arranged in a plurality of rows that are located between the first and second backside trenches;
the plurality of rows comprise first and second boundary rows that extend along the first horizontal direction adjacent to the first and second backside trenches, and at least one inner row that extends along the first horizontal direction between the first and second boundary rows;
the first support pillar structures have the same pitch in the first and second boundary rows and the at least one inner row; and
the second support pillar structures are located between the first support pillar structures in the first and second boundary rows, but are not located in the at least one inner row to provide an asymmetric support pillar configuration.

* * * * *